(12) United States Patent
Tamura et al.

(10) Patent No.: US 11,164,843 B2
(45) Date of Patent: Nov. 2, 2021

(54) SUBSTRATE BONDING APPARATUS

(71) Applicant: Kioxia Corporation, Minato-ku (JP)

(72) Inventors: Hironobu Tamura, Yokkaichi (JP); Yoshiharu Ono, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/816,654

(22) Filed: Mar. 12, 2020

(65) Prior Publication Data
US 2021/0082863 A1 Mar. 18, 2021

(30) Foreign Application Priority Data
Sep. 13, 2019 (JP) .............................. JP2019-167671

(51) Int. Cl.
*H01L 23/00* (2006.01)
*H01L 21/683* (2006.01)

(52) U.S. Cl.
CPC .......... *H01L 24/75* (2013.01); *H01L 21/6838* (2013.01); *H01L 2224/75744* (2013.01); *H01L 2224/75983* (2013.01)

(58) Field of Classification Search
CPC . H01L 24/75; H01L 21/6833; H01L 21/6838; H01L 2224/75744; H01L 2224/75983; H01L 2224/767; H01L 2224/76743; H01L 2224/76744; H01L 2224/76745; H01L 2224/777; H01L 2224/77743; H01L 2224/77744; H01L 2224/77745; H01L 2224/787; H01L 2224/78743; H01L 2224/78744; H01L 2224/78745; H01L 2224/797;
(Continued)

(56) References Cited

U.S. PATENT DOCUMENTS

| 2011/0083786 | A1* | 4/2011 | Guo .................... B32B 37/0007 156/64 |
| 2012/0077329 | A1 | 3/2012 | Broekaart et al. |

(Continued)

FOREIGN PATENT DOCUMENTS

| CN | 106556939 A | 4/2017 |
| CN | 107706129 A | 2/2018 |

(Continued)

*Primary Examiner* — George R Koch
(74) *Attorney, Agent, or Firm* — Oblon, McClelland, Maier & Neustadt, L.L.P.

(57) ABSTRACT

According to one embodiment, in a substrate bonding apparatus a first chucking stage includes a first stage base, a plurality of first cylindrical members, and a plurality of first drive mechanisms. The first stage base includes a first main face facing a second chucking stage. The plurality of first cylindrical members are disposed on the first main face. The plurality of first cylindrical members are arrayed in planar directions. The plurality of first cylindrical members protrudes from the first main face in a direction toward the second chucking stage to chuck the first substrate. The plurality of first drive mechanisms are configured to drive the plurality of first cylindrical members independently of each other. The substrate bonding apparatus further comprises a first pressure control mechanism configured to control pressure states of spaces in the plurality of first cylindrical members independently of each other.

20 Claims, 12 Drawing Sheets

(58) Field of Classification Search
CPC . H01L 2224/79743; H01L 2224/79744; H01L 2224/79745; H01L 21/6875; H01L 21/68764
See application file for complete search history.

(56) References Cited

U.S. PATENT DOCUMENTS

| | | |
|---|---|---|
| 2013/0330165 A1 | 12/2013 | Wimplinger et al. |
| 2015/0228521 A1 | 8/2015 | Wimplinger et al. |
| 2018/0019140 A1 | 1/2018 | Inamasu |
| 2019/0189593 A1* | 6/2019 | Kim ........................ H01L 22/12 |
| 2019/0206711 A1 | 7/2019 | Wimplinger et al. |

FOREIGN PATENT DOCUMENTS

| | | |
|---|---|---|
| JP | 5272348 B2 | 8/2013 |
| JP | 5558452 B2 | 7/2014 |
| JP | 5584905 B2 | 9/2014 |
| JP | 5682106 B2 | 3/2015 |
| JP | 2015-88590 A | 5/2015 |
| JP | 5865475 B2 | 2/2016 |
| JP | 2018-10925 A | 1/2018 |
| JP | 6279324 B2 | 2/2018 |

\* cited by examiner

SUBSTRATE BONDING APPARATUS

CROSS-REFERENCE TO RELATED APPLICATIONS

This application is based upon and claims the benefit of priority from Japanese Patent Application No. 2019-167671, filed on Sep. 13, 2019; the entire contents of which are incorporated herein by reference.

FIELD

Embodiments described herein relate generally to a substrate bonding apparatus.

BACKGROUND

A substrate bonding apparatus chucks two substrates on two chucking stages, and bonds the two substrates to each other by setting the two chucking stages closer to each other. At this time, it is desirable to bond the two substrates with high accuracy.

DETAILED DESCRIPTION

Figure 1:
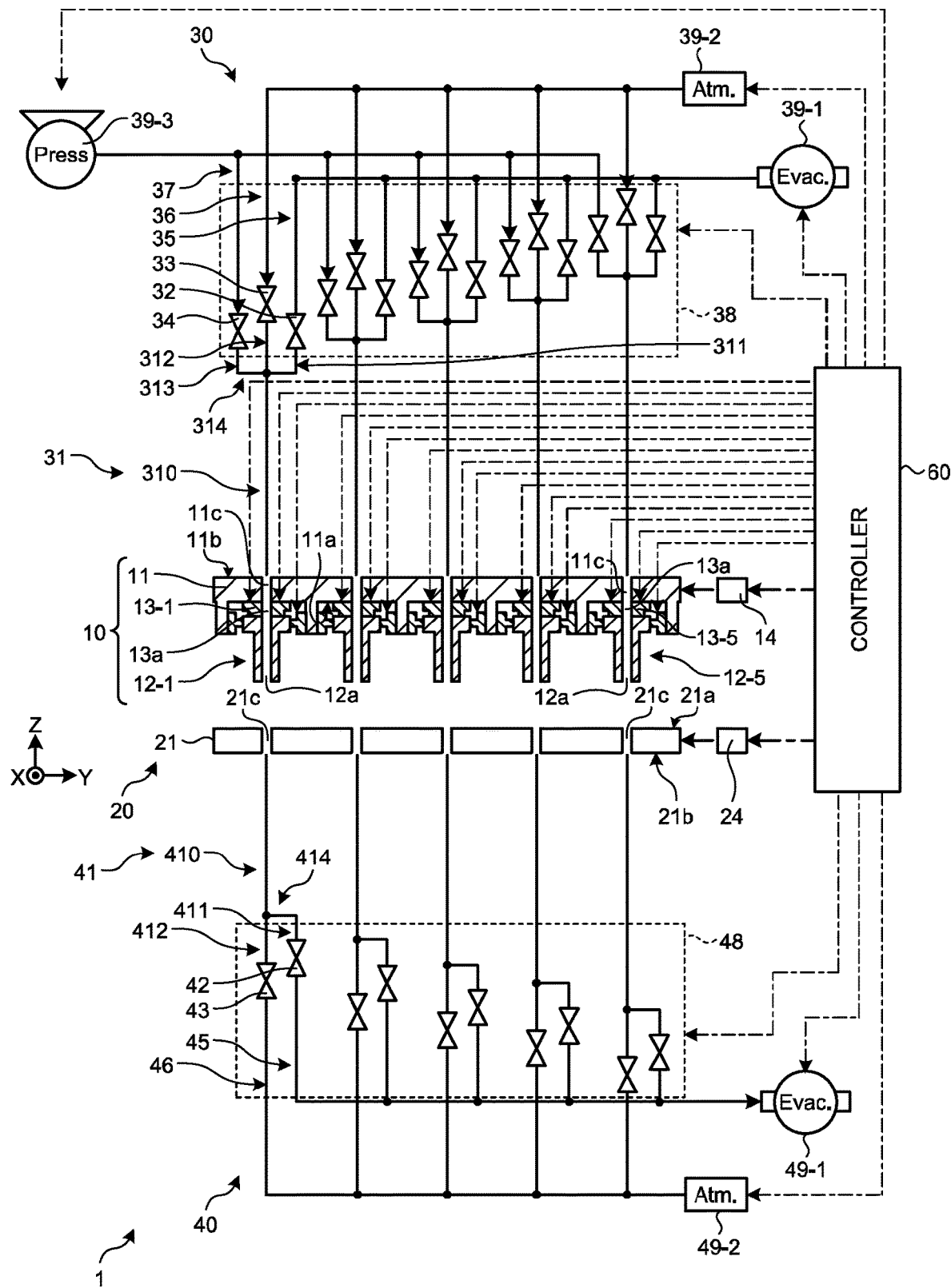
FIG. 1 is a diagram illustrating a configuration of a substrate bonding apparatus according to a first embodiment.

In general, according to one embodiment, there is provided a substrate bonding apparatus including a first chucking stage, and a second chucking stage. The first chucking stage is configured to chuck a first substrate. The second chucking stage is disposed facing the first chucking stage. The second chucking stage is configured to chuck a second substrate. The first chucking stage includes a first stage base, a plurality of first cylindrical members, and a plurality of first drive mechanisms. The first stage base includes a first main face facing the second chucking stage. The plurality of first cylindrical members are disposed on the first main face. The plurality of first cylindrical members are arrayed in planar directions. The plurality of first cylindrical members protrudes from the first main face in a direction toward the second chucking stage to chuck the first substrate. The plurality of first drive mechanisms are configured to drive the plurality of first cylindrical members independently of each other. The substrate bonding apparatus further comprises a first pressure control mechanism configured to control pressure states of spaces in the plurality of first cylindrical members independently of each other.

Exemplary embodiments of a substrate bonding apparatus will be explained below in detail with reference to the accompanying drawings. The present invention is not limited to the following embodiments.

First Embodiment

A substrate bonding apparatus according to a first embodiment chucks two substrates (such as two wafers) on two chucking stages, and bonds the two substrates to each other. For example, the electrodes of the two substrates are joined to each other to form a semiconductor integrated circuit, and the semiconductor integrated circuit can thereby be higher in density and higher in function. Specifically, joint electrodes are formed on the respective surfaces of the two substrates to be paired, and then the two substrates are laid one on the other and the electrodes are mutually joined to complete the lamination of the substrates. At this time, it is desirable to bond the two substrates with high accuracy, in order to mutually join the electrodes of the two substrates and thereby appropriately form the semiconductor integrated circuit. Further, in consideration of the bonding of the two substrates from the view point of voids, it is desirable to set the surfaces to be mutually joined in an activated state, so as to perform the bonding without involving gas bubbles. Further, in consideration of the bonding of the two substrates from the view point of alignment, it is desirable to perform alignment between the substrates at a submicron level, so as to mutually join the electrodes of the substrates to be paired without any positional deviation therebetween.

For example, as regards integration at the substrate level, in place of two-dimensional miniaturization, high integration is achieved by stacking three-dimensional circuit patterns, a representative of which is a three-dimensional memory (such as a three-dimensional flash memory). As a result, due to anisotropic stress distortion caused by such high stacking, a large warp occurs at the substrate level, and the substrate may come to have a surface shape with complicated topography when the substrate is chucked by the chucking stage. In this case, it is desirable to correct both of the topography and the positional deviation in the substrate plane at the same time. However, it is very difficult to mutually bond substrates having such a large warp, without gas bubbles and without electrode deviations in the substrate plane.

For this purpose, it is conceivable to provide a stage with temperature control functions at a plurality of locations, and to perform distortion correction by thermally expanding one of the substrates more than the other substrate in accordance with a temperature distribution. In this case, there may be a concern that the dimensional magnification on the substrate varies due to heat accumulation, and electrode positions become unmatched between the two substrates. Further, there may be a concern that the other substrate also thermally expands at the time of bonding and the distortion difference between the substrates is not canceled. Thus, it is desirable to perform distortion correction on the two substrates to be mutually bonded, without relying on thermally expansion.

In consideration of the above, in the substrate bonding apparatus according to the embodiment, a substrate is chucked and supported at multiple points by a plurality of cylindrical members protruding from one of two chucking stages in a direction toward the other stage. Then, at least one of individual drive control on the plurality of cylindrical members and individual pressure control on spaces in the plurality of cylindrical members is performed, so as to physically correct the distortion of the substrate.

Specifically, the substrate bonding apparatus 1 may be configured as illustrated in FIG. 1. FIG. 1 is a diagram illustrating a configuration of the substrate bonding apparatus 1.

The substrate bonding apparatus 1 includes a chucking stage 10, a chucking stage 20, a pressure control mechanism 30, a pressure control mechanism 40, and a controller 60.

The chucking stage 10 and the chucking stage 20 are disposed to face each other in use. The chucking stage 10 includes a stage base 11 having a substantially flat plate contour, and the chucking stage 20 includes a stage base 21 having a substantially flat plate contour. The stage base 11 includes a main face 11a on a side facing the stage base 21, and the stage base 21 includes a main face 21a on a side facing the stage base 11. Hereinafter, it is assumed that the direction perpendicular to the main face 21a of the stage base 21 is a Z-direction and the two directions orthogonal to each other in the plane perpendicular to the Z-direction are an X-direction and a Y-direction.

In addition to the stage base 11, the chucking stage 10 includes a plurality of cylindrical members 12-1 to 12-5, a plurality of drive mechanisms 13-1 to 13-5, and a drive mechanism 14. The chucking stage 10 chucks and holds a substrate by the plurality of cylindrical members 12-1 to 12-5, drives the plurality of cylindrical members 12-1 to 12-5 collectively by the drive mechanism 14, and drives the plurality of cylindrical members 12-1 to 12-5 independently of each other by the plurality of drive mechanisms 13-1 to 13-5. Each of the plurality of cylindrical members 12-1 to 12-5 protrudes in the −Z-direction from the main face 11a of the stage base 11, and includes a hole 12a penetrating in the Z-direction, to chuck and hold the substrate at its −Z-side distal end when the hole 12a is controlled to be in a depressurized state. The plurality of cylindrical members 12-1 to 12-5 support the substrate at positions different from each other in the X- and Y-directions. Consequently, the substrate is supported at multiple points. The drive mechanism 14 drives the stage base 11 in the X-, Y-, and Z-directions under the control of the controller 60, to move the plurality of cylindrical members 12-1 to 12-5 collectively and globally. The plurality of drive mechanisms 13-1 to 13-5 moves plurality of cylindrical members 12-1 to 12-5 individually under the control of the controller 60.

The stage base 11 has a flat plate shape extending in the X- and Y-directions, and includes the main face 11a on the −Z-side and a main face 11b on the +Z-side. The stage base 11 includes a plurality of holes 11c extending in the Z-direction and penetrating the stage base 11 from the main face 11a to the main face 11b.

The plurality of cylindrical members 12-1 to 12-5 are disposed on the main face 11a, and are arrayed in the X- and Y-directions. The plurality of drive mechanisms 13-1 to 13-5 correspond to the plurality of cylindrical members 12-1 to 12-5, respectively. Each of the drive mechanisms 13 is disposed around the corresponding cylindrical member 12.

Figure 2A:
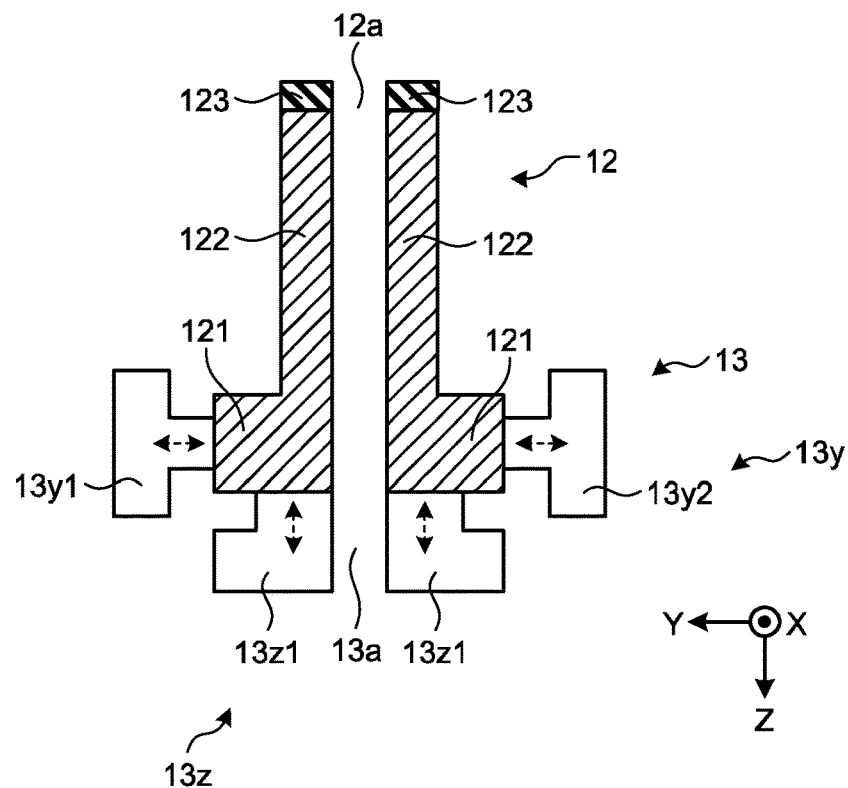
FIGS. 2A and 2B are diagrams illustrating configurations of a cylindrical member and a drive mechanism in the first embodiment.
Figure 2B:
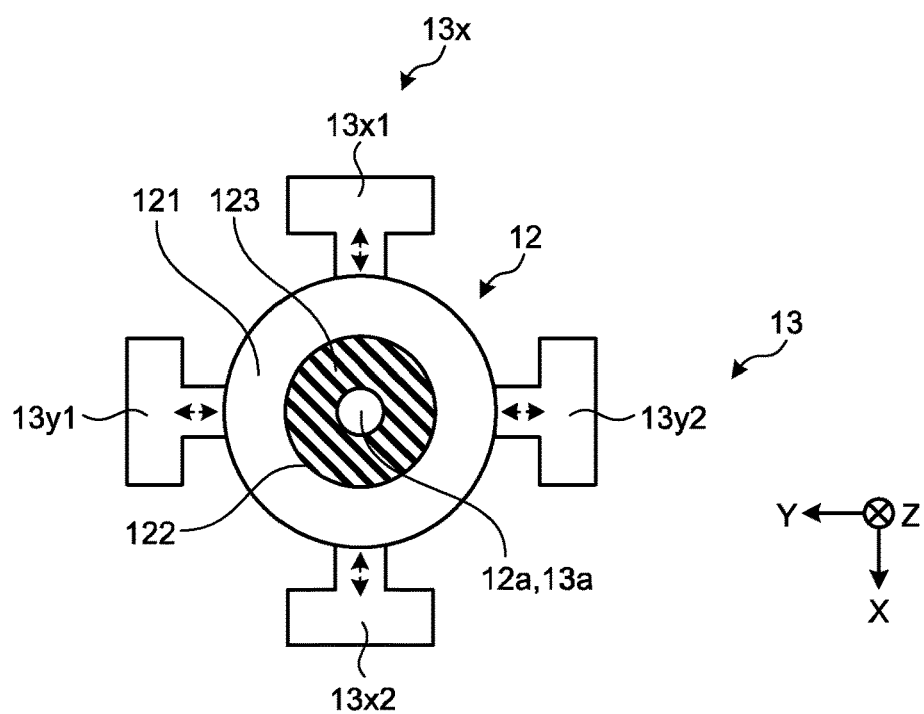

For example, each cylindrical member 12 and the drive mechanism 13 corresponding thereto are configured as illustrated in FIGS. 2A and 2B. FIG. 2A is a side view illustrating configurations of the cylindrical member 12 and the drive mechanism 13. FIG. 2B is a plan view illustrating configurations of the cylindrical member 12 and the drive mechanism 13.

The cylindrical member 12 has a substantially cylindrical shape and includes the hole 12a. The hole 12a extends in the Z-direction, and penetrates the cylindrical member 12. The cylindrical member 12 includes a large diameter portion 121, a small diameter portion 122, and a buffer portion 123.

The large diameter portion 121 extends in a cylindrical shape surrounding the hole 12a. The large diameter portion 121 has a diameter larger than that of the small diameter portion 122. The large diameter portion 121 is disposed on the +Z-side of the small diameter portion 122, and is connected to the +Z-side end of the small diameter portion 122. The large diameter portion 121 is disposed on the +Y-side and the −Y-side with the hole 12a interposed therebetween, when seen in the YZ-section, and extends in a circular shape surrounding the hole 12a, when seen in the XY-plane.

The small diameter portion 122 extends in a cylindrical shape surrounding the hole 12a. The small diameter portion 122 has a diameter smaller than that of the large diameter portion 121. The small diameter portion 122 is disposed on the −Z-side of the large diameter portion 121, and is connected to the −Z-side end of the large diameter portion 121. The small diameter portion 122 is disposed on the +Y-side and the −Y-side with the hole 12a interposed therebetween, when seen in the YZ-section, and extends in a circular shape surrounding the hole 12a, when seen in the XY-plane.

The buffer portion 123 is a portion to be in contact with the substrate when the cylindrical member 12 holds the substrate. The buffer portion 123 is disposed on the −Z-side of the small diameter portion 122, and is connected to the −Z-side end of the small diameter portion 122. The buffer portion 123 may be made of an elastic material, such as rubber. The buffer portion 123 extends in a cylindrical shape surrounding the hole 12a. The buffer portion 123 has a diameter substantially equal to that of the small diameter portion 122.

The drive mechanism 13 is disposed around the cylindrical member 12, and is configured to drive the cylindrical member 12 in the X-, Y-, and Z-directions. The drive mechanism 13 includes a plurality of drive parts $13x$, $13y$, and $13z$.

The drive part $13x$ can drive the cylindrical member 12 in the X-direction under the control of the controller 60. The drive part $13x$ includes a pair of drive elements $13x1$ and $13x2$, and drives the cylindrical member 12 in the X-direction by the pair of drive elements $13x1$ and $13x2$ made in an interlocking state. For example, each of the drive elements $13x1$ and $13x2$ is formed of a piezo element, motor, solenoid, or the like. As illustrated by dotted line arrows in FIG. 2B, when the protrusion of the drive element $13x1$ contracts in the +X-direction and the protrusion of the drive element $13x2$ expands in the +X-direction, the cylindrical member 12 is moved in the +X-direction. When the protrusion of the drive element $13x1$ expands in the −X-direction and the protrusion of the drive element 13x2 contracts in the −X-direction, the cylindrical member 12 is moved in the −X-direction.

The drive part 13y can drive the cylindrical member 12 in the Y-direction under the control of the controller 60. The drive part 13y includes a pair of drive elements 13y1 and 13y2, and drives the cylindrical member 12 in the Y-direction by the pair of drive elements 13y1 and 13y2 made in an interlocking state. For example, each of the drive elements 13y1 and 13y2 is formed of a piezo element, motor, solenoid, or the like. As illustrated by dotted line arrows in FIGS. 2A and 2B, when the protrusion of the drive element 13y1 contracts in the +Y-direction and the protrusion of the drive element 13y2 expands in the +Y-direction, the cylindrical member 12 is moved in the +Y-direction. When the protrusion of the drive element 13y1 expands in the −Y-direction and the protrusion of the drive element 13y2 contracts in the −Y-direction, the cylindrical member 12 is moved in the −Y-direction.

The drive part 13z can drive the cylindrical member 12 in the Z-direction under the control of the controller 60. The drive part 13z includes a drive element 13z1, and drives the cylindrical member 12 in the Z-direction by the drive element 13z1. For example, the drive element 13z1 is formed of a piezo element, motor, solenoid, or the like. As illustrated by dotted line arrows in FIG. 2A, when the protrusion of the drive element 13z1 contracts in the +Z-direction, the cylindrical member 12 is moved in the +Z-direction. When the protrusion of the drive element 13z1 expands in the −Z-direction, the cylindrical member 12 is moved in the −Z-direction.

Further, the drive part 13z includes a hole 13a. The hole 13a extends in the Z-direction, and penetrates the drive part 13z. The hole 13a of the drive part 13z communicates on the −Z-side with the hole 12a of the cylindrical member 12, and communicates on the +Z-side with the hole 11a of the stage base 11.

As illustrated in FIG. 1, the stage base 21 of the chucking stage 20 has a flat plate shape extending in the X- and Y-directions, and includes the main face 21a on the +Z-side and a main face 21b on the −Z-side. The stage base 21 includes a plurality of holes 21c extending in the Z-direction and penetrating the stage base 21 from the main face 21a to the main face 21b.

The pressure control mechanism 30 controls the pressure states of spaces in the plurality of cylindrical members 12-1 to 12-5 independently of each other under the control of the controller 60. The pressure control mechanism 30 includes a plurality of tubes 31, a plurality of pressure generation units 39-1 to 39-3, and a switching section 38.

The plurality of tubes 31 communicate with the spaces in the plurality of cylindrical members 12-1 to 12-5. Each of the tubes 31 has an inner space that communicates with the hole 12a of the corresponding cylindrical member 12 through the corresponding hole 11c and hole 13a.

Each of the tubes 31 includes a main tube 310 and branch tubes 311 to 313. The main tube 310 is connected on one end to the chucking stage 10, and is connected on the other end to one ends of the respective branch tubes 311 to 313 through a branching node 314. The other ends of the plurality of branch tubes 311 to 313 are connected to the plurality of pressure generation units 39-1 to 39-3, respectively, through the switching section 38.

The plurality of pressure generation units 39-1 to 39-3 generate pressure states different from each other. For example, the pressure generation unit 39-1 is a depressurizing unit, such as a vacuum pump, and generates a depressurized state by applying a negative pressure to gas under the control of the controller 60. The pressure generation unit 39-2 is an atmosphere opening unit, and generates an atmospheric pressure state by setting gas open to the atmosphere under the control of the controller 60. The pressure generation unit 39-3 is a pressurizing unit, such as a compressor, and generates a pressurized state by applying a positive pressure to gas under the control of the controller 60.

The switching section 38 can connect each of the plurality of tubes 31 to any one of the plurality of pressure generation units 39-1 to 39-3 under the control of the controller 60. The switching section 38 can individually switch the connection between each of the tubes 31 to the plurality of pressure generation units 39-1 to 39-3. The switching section 38 individually connects each of the tubes 31 to any one of the plurality of pressure generation units 39-1 to 39-3 under the control of the controller 60.

The switching section 38 includes on-off valves 32, on-off valves 33, a depressurizing tube (depressurizing line) 35, an atmospheric tube (atmosphere opening line) 36, and a pressurizing tube (pressurizing line) 37. Each of the on-off valves 32 opens/closes the connection between the corresponding tube 31 (branch tube 311) and the depressurizing tube 35 under the control of the controller 60. When an on-off valve 32 is in an opened state, the pressure generation unit (depressurizing unit) 39-1 can vacuum-exhaust the hole 12a of the corresponding cylindrical member 12 and thereby set this hole 12a into a depressurized state, through the corresponding hole 11c, hole 13a, and tube 31, and the depressurizing tube 35. Each of the on-off valves 33 opens/closes the connection between the corresponding tube 31 (branch tube 311) and the atmospheric tube 36 under the control of the controller 60. When an on-off valve 33 is in an opened state, the pressure generation unit (atmosphere opening unit) 39-2 can set the hole 12a of the corresponding cylindrical member 12 open to the atmosphere and thereby set this hole 12a into an atmospheric pressure state, through the corresponding hole 11c, hole 13a, and tube 31, and the atmospheric tube 36. When an on-off valve 34 is in an opened state, the pressure generation unit (pressurizing unit) 39-3 can supply gas into the hole 12a of the corresponding cylindrical member 12 and thereby set this hole 12a into a pressurized state, through the corresponding hole 11c, hole 13a, and tube 31, and the pressurizing tube 37.

In addition to the stage base 21, the chucking stage 20 includes a drive mechanism 24. The chucking stage 20 chucks and holds a substrate by the stage base 21, and drives the stage base 21 by the drive mechanism 24. The stage base 21 has a flat plate shape extending in the X- and Y-directions, and includes the main face 21a on the +Z-side and the main face 21b on the −Z-side. The stage base 21 includes a plurality of holes 21c extending in the Z-direction and penetrating the stage base 21 from the main face 21a to the main face 21b. The stage base 21 can chuck and hold the substrate by the main face 21a when the holes 21c are controlled to be in a depressurized state. The drive mechanism 24 drives the stage base 21 in the X-, Y-, and Z-directions under the control of the controller 60.

The pressure control mechanism 40 controls the pressure states of spaces in the stage base 21 independently of each other under the control of the controller 60. The pressure control mechanism 40 includes a plurality of tubes 41, a plurality of pressure generation units 49-1 and 49-2, and a switching section 48.

The plurality of tubes 41 communicate with the spaces in the stage base 21. Each of the tubes 41 has an inner space that communicates with the corresponding hole 12c of the stage base 21.

Each of the tubes 41 includes a main tube 410 and branch tubes 411 and 412. The main tube 410 is connected on one end to the chucking stage 20, and is connected on the other end to one ends of the respective branch tubes 411 and 412 through a branching node 414. The other ends of the plurality of branch tubes 411 and 412 are connected to the plurality of pressure generation units 49-1 and 49-2, respectively, through the switching section 48.

The plurality of pressure generation units 49-1 and 49-2 generate pressure states different from each other. For example, the pressure generation unit 49-1 is a depressurizing unit, such as a vacuum pump, and generates a depressurized state by applying a negative pressure to gas under the control of the controller 60. The pressure generation unit 49-2 is an atmosphere opening unit, and generates an atmospheric pressure state by setting gas open to the atmosphere under the control of the controller 60.

The switching section 48 can connect each of the plurality of tubes 41 to either one of the plurality of pressure generation units 49-1 and 49-2 under the control of the controller 60. The switching section 48 can individually switch the connection between each of the tubes 41 to the plurality of pressure generation units 49-1 and 49-2. The switching section 48 individually connects each of the tubes 41 to either one of the plurality of pressure generation units 49-1 and 49-2 under the control of the controller 60.

The switching section 48 includes on-off valves 42, on-off valves 43, a depressurizing tube (depressurizing line) 45, and an atmospheric tube (atmosphere opening line) 46. Each of the on-off valves 42 opens/closes the connection between the corresponding tube 41 (branch tube 411) and the depressurizing tube 45 under the control of the controller 60. When an on-off valve 42 is in an opened state, the pressure generation unit (depressurizing unit) 49-1 can vacuum-exhaust the corresponding hole 21c of the stage base 21 and thereby set this hole 21c into a depressurized state, through the corresponding tube 41 and the depressurizing tube 45. Each of the on-off valves 43 opens/closes the connection between the corresponding tube (branch tube 411) and the atmospheric tube 46 under the control of the controller 60. When an on-off valve 43 is in an opened state, the pressure generation unit (atmosphere opening unit) 49-2 can set the corresponding hole 21c of the stage base 21 open to the atmosphere and thereby set this hole 21c into an atmospheric pressure state, through the corresponding tube 41 and the atmospheric tube 46.

In a case where a substrate W3 corresponding to a substrate W1 to be chucked by the chucking stage 10 (see FIG. 4A) and a substrate W4 corresponding to a substrate W2 to be chucked by the chucking stage 20 (see FIG. 4A) are prepared, the controller 60 acquires a distortion correction amount for the distortion of the substrate W3 with respect to the substrate W4, as pre-processing. The distortion correction amount for the substrate W3 with respect to the substrate W4 can be deemed to indicate a distortion correction amount for the substrate W1 with respect to the substrate W2. In accordance with the distortion correction amount for the substrate W3 (i.e., the distortion correction amount for the substrate W1), the controller 60 controls at least one of the set of plurality of drive mechanisms 13-1 to 13-5 and the pressure control mechanism 30 to correct the distortion of the substrate W1, under a state where the substrate W1 is chucked by the plurality of cylindrical members 12-1 to 12-5.

Figure 3:
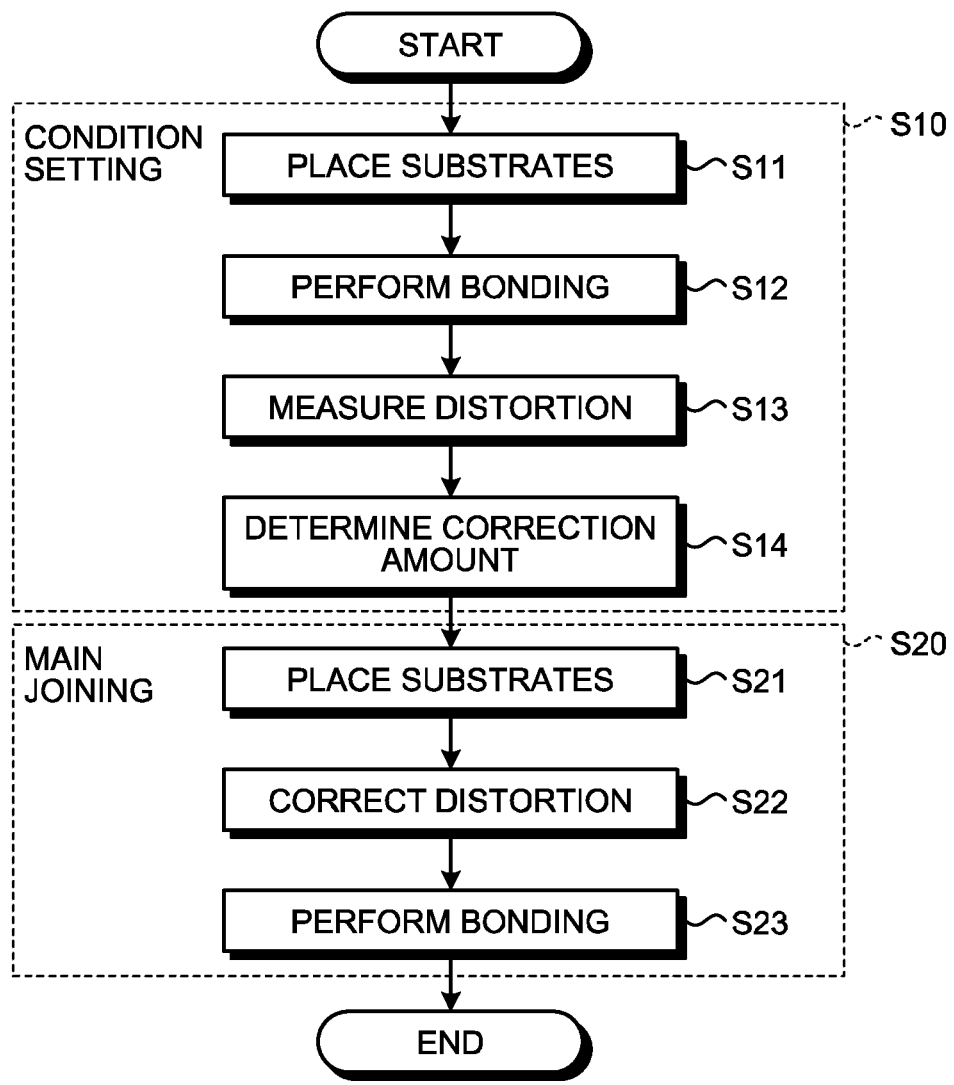
FIG. 3 is a flowchart illustrating an operation of the substrate bonding apparatus according to the first embodiment.

For example, as regards the distortion correction for the substrate W1, an operation is performed as illustrated in FIG. 3. FIG. 3 is a flowchart illustrating an operation of the substrate bonding apparatus 1.

In the substrate bonding apparatus 1, prior to the main joining (S20), the controller 60 performs condition setting (S10) to obtain a distortion correction amount for the substrate W3 (i.e., a distortion correction amount for the substrate W1).

Specifically, the controller 60 operates to place the substrate W3 and the substrate W4 to face each other (S11). The substrate W3 corresponds to the substrate W1 to be used in the main joining, and is the same as the substrate W1, for example, in shape, projection amount, material, and thickness. The substrate W4 corresponds to the substrate W2 to be used in the main joining, and is the same as the substrate W2, for example, in shape, projection amount, material, and thickness.

Figure 4A:
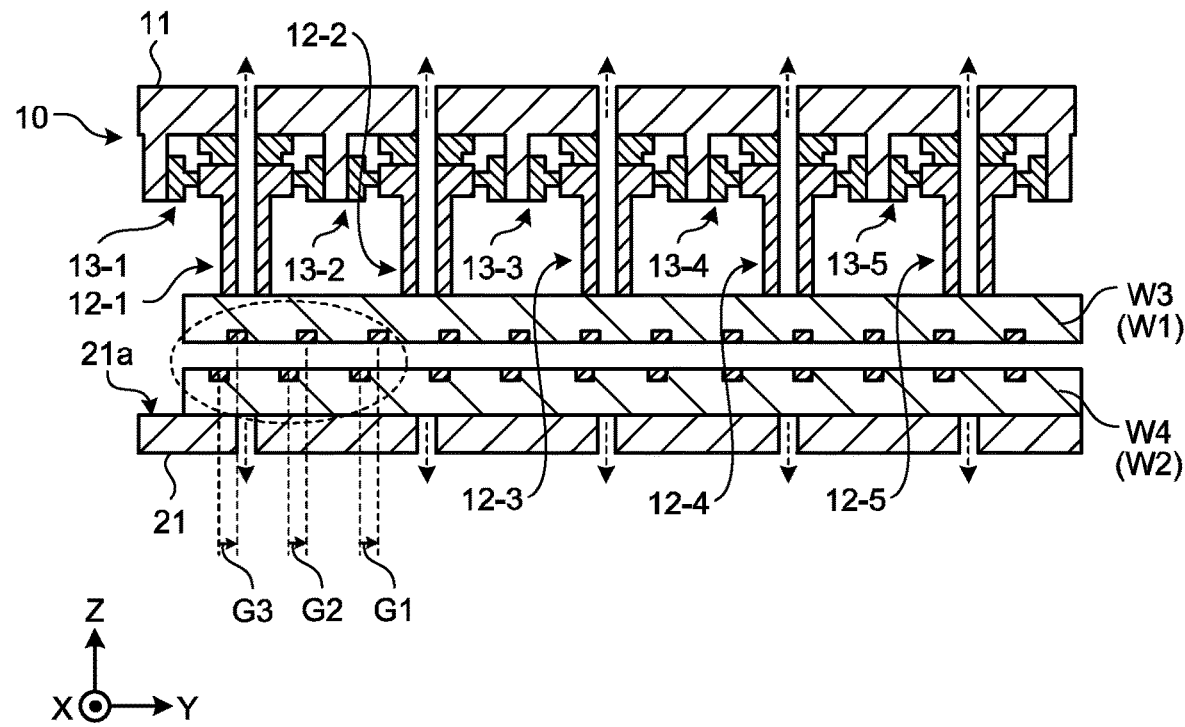
FIGS. 4A and 4B are diagrams illustrating an operation concerning correction in the first embodiment.

For example, as illustrated in FIG. 4A, the controller 60 performs control to set the holes 12a of the plurality of cylindrical members 12-1 to 12-5 of the chucking stage 10 into a depressurized state to chuck the substrate W3 at the −Z-side distal ends of the plurality of cylindrical members 12-1 to 12-5, and further to chuck the substrate W4 by the main face 21a of the chucking stage 20. Thereafter, the controller 60 operates to drive the chucking stages 10 and 20 (stage bases 11 and 21) relative to each other in the X- and Y-directions to align the electrode pads of the two substrates W3 and W4 with each other. FIG. 4A is a diagram illustrating an operation concerning correction for the substrate W1.

The controller 60 operates to bring the substrate W3 into contact with the substrate W4, while deforming the substrate W3 such that the central portion of the substrate W3 becomes convex toward the substrate W4, to bond the substrate W3 and the substrate W4 to each other (S12).

For example, the controller 60 controls a drive mechanism 13 corresponding to the central portion of the substrate W3 (the drive mechanism 13-3 in the case of FIG. 4A) to move the corresponding cylindrical member 12 (the cylindrical member 12-3 in the case of FIG. 4A) in the −Z-direction, so as to deform the substrate W3 such that the central portion of the substrate W3 becomes convex toward the substrate W4. The controller 60 controls the plurality of drive mechanisms 13-1 to 13-5 to move the plurality of cylindrical members 12-1 to 12-5 in the −Z-direction into contact with the substrate W4. The controller 60 controls the pressure control mechanism 30 to release the depressurized states of the spaces (holes 12a) in the plurality of cylindrical members 12-1 to 12-5 sequentially from the central portion of the substrate W3 to the outer side (in the order of 12-3→12-2 and 12-4→12-1 and 12-5, in the case of FIG. 4A), so as to bond the substrate W3 and the substrate W4 to each other.

The controller 60 operates to measure the amount and direction of the positional deviation for the bonding between the substrate W3 and the substrate W4 (S13). Specifically, for the plurality of electrode pads of the substrate W3 and the plurality of electrode pads of the substrate W4, the controller 60 operates to measure the deviation between the position of each electrode pad of the substrate W3 and the position of the corresponding electrode pad of the substrate W4.

For example, the controller 60 operates to image the electrode pads of the substrate W3, and performs image processing to obtain the center of each electrode pad to be aligned (for example, its gravity center) and regard this center as the position of the electrode pad. Similarly, the controller 60 operates to image the electrode pads of the substrate W4, and performs image processing to obtain the center of each electrode pad and regard this center as the position of the electrode pad.

Then, as illustrated by a surrounding dotted line in FIG. 4A, the controller 60 performs image processing and thereby specifies that positional deviations have occurred in a region on the −Y-side of the substrate W3, and further obtains deviations G1 to G3 of the positions of these electrode pads of the substrate W3 with respect to the positions of the corresponding electrode pads of the substrate W4. Each of the deviations G1 to G3 can be deemed as a vector quantity with magnitude and direction. For example, each of the deviations G1 to G3 has a direction toward the central portion of the substrate W3 from the outer side (the rightward direction in FIG. 4A).

The controller 60 obtains a correction amount (S14) that corresponds to the distortion position and the distortion correction measured in S13. For example, the controller 60 calculates drive amounts in the X- and Y-directions, which are reverse in direction and equivalent in magnitude with respect to the positional deviation of each electrode pad measured in S13.

For example, when the measurement in S13 indicates that, in a region on the −Y-side of the substrate W3, the positions of electrode pads of the substrate W3 are deviated from the positions of electrode pads of the substrate W4 toward the central portion side (see FIG. 4A), the controller 60 determines respective movement amounts of cylindrical members 12 to cancel the deviations. Specifically, the controller 60 may set the movement amount of the cylindrical member 12-1 to $\Delta Y1=-G3$, and set the movement amount of the cylindrical member 12-2 to $\Delta Y2=-G1$.

Then, the controller 60 executes the main joining (S20) to bond two substrates to each other, by using the correction amounts obtained in the condition setting (S10).

Specifically, the controller 60 operates to place the substrate W1 and the substrate W2 to face each other (S21). For example, as illustrated in FIG. 4A, the controller 60 performs control to set the holes 12a of the plurality of cylindrical members 12-1 to 12-5 of the chucking stage 10 into a depressurized state to chuck the substrate W1 at the −Z-side distal ends of the plurality of cylindrical members 12-1 to 12-5, and further to chuck the substrate W2 by the main face 21a of the chucking stage 20. Thereafter, the controller 60 operates to drive the chucking stages 10 and 20 (stage bases 11 and 21) relative to each other in the X- and Y-directions to align the electrode pads of the two substrates W1 and W2 with each other.

In accordance with the distortion correction amount determined in S14, the controller 60 controls at least one of the set of plurality of drive mechanisms 13 and the pressure control mechanism 30 to correct the distortion of the substrate W1.

Figure 4B:
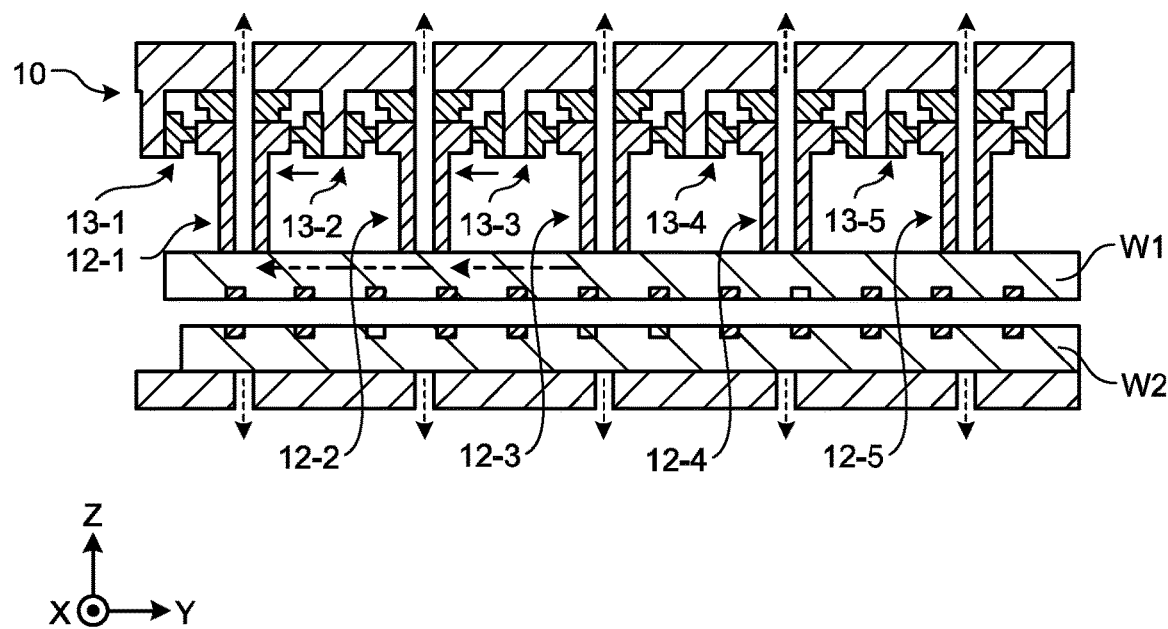

For example, as illustrated in FIG. 4B, the controller 60 operates to move the cylindrical member 12-1 in the −Y-direction by the movement amount $\Delta Y1=-G3$, and move the cylindrical member 12-2 in the −Y-direction by the movement amount $\Delta Y2=-G1$. At this time, as the position of the cylindrical member 12-3 is fixed, a stress in an elastic distortion mode illustrated by a one-dot chain line can be applied between the chucking position of the cylindrical member 12-3 and the chucking position of the cylindrical member 12-2 on the substrate W1. Further, as both of the cylindrical member 12-1 and the cylindrical member 12-2 are moved, a stress in a forcible distortion mode illustrated by a two-dot chain line can be applied between the chucking position of the cylindrical member 12-2 and the chucking position of the cylindrical member 12-1 on the substrate W1. Consequently, the distortion of the substrate W1 can be corrected, for example, in a manner in which the distortion at a location with a larger distortion is corrected while the distance between any two points is changed in the elastic distortion mode, and in which the distortion at a location with a smaller distortion is corrected while the distance between any two points is maintained in the forced distortion mode.

The controller 60 operates to bring the substrate W1 into contact with the substrate W2, while deforming the substrate W1 such that the central portion of the substrate W1 becomes convex toward the substrate W2, to bond the substrate W1 and the substrate W2 to each other (S23).

For example, the controller 60 controls a drive mechanism 13 corresponding to the central portion of the substrate W1 (the drive mechanism 13-3 in the case of FIG. 4B) to move the corresponding cylindrical member 12 (the cylindrical member 12-3 in the case of FIG. 4B) in the −Z-direction, so as to deform the substrate W1 such that the central portion of the substrate W1 becomes convex toward the substrate W2. The controller 60 controls the plurality of drive mechanisms 13-1 to 13-5 to move the plurality of cylindrical members 12-1 to 12-5 in the −Z-direction into contact with the substrate W2. The controller 60 controls the pressure control mechanism 30 to release the depressurized states of the spaces (holes 12a) in the plurality of cylindrical members 12-1 to 12-5 sequentially from the central portion of the substrate W1 to the outer side (in the order of 12-3→12-2 and 12-4→12-1 and 12-5, in the case of FIG. 4B), so as to bond the substrate W1 and the substrate W2 to each other.

As described above, in the substrate bonding apparatus 1 according to the embodiment, the substrate W1 is chucked and supported at multiple points by the plurality of cylindrical members 12-1 to 12-5 protruding from the chucking stage 10 in a direction toward the chucking stage 20. Then, at least one of individual drive control on the plurality of cylindrical members 12-1 to 12-5 and individual pressure control on the spaces in the plurality of cylindrical members is performed. Consequently, as the distortion of the substrate W1 can be physically corrected, it is possible to avoid the influence of thermal expansion and to reliably correct the substrate distortion difference. Further, where a substrate has complicated topography, the distortion of the substrate due to this topography can be corrected. As a result, it is possible to bond the two substrates W1 and W2 to each other with high accuracy.

Here, in the operation illustrated as an example in FIGS. 4A and 4B, individual drive control on the plurality of cylindrical members 12-1 to 12-5 is used to perform distortion correction on the substrate W1. However, a combination of individual drive control on the plurality of cylindrical members 12-1 to 12-5 with individual pressure control on the spaces in the plurality of cylindrical members 12-1 to 12-5 may be used to perform distortion correction on the substrate W1.

Figure 5:
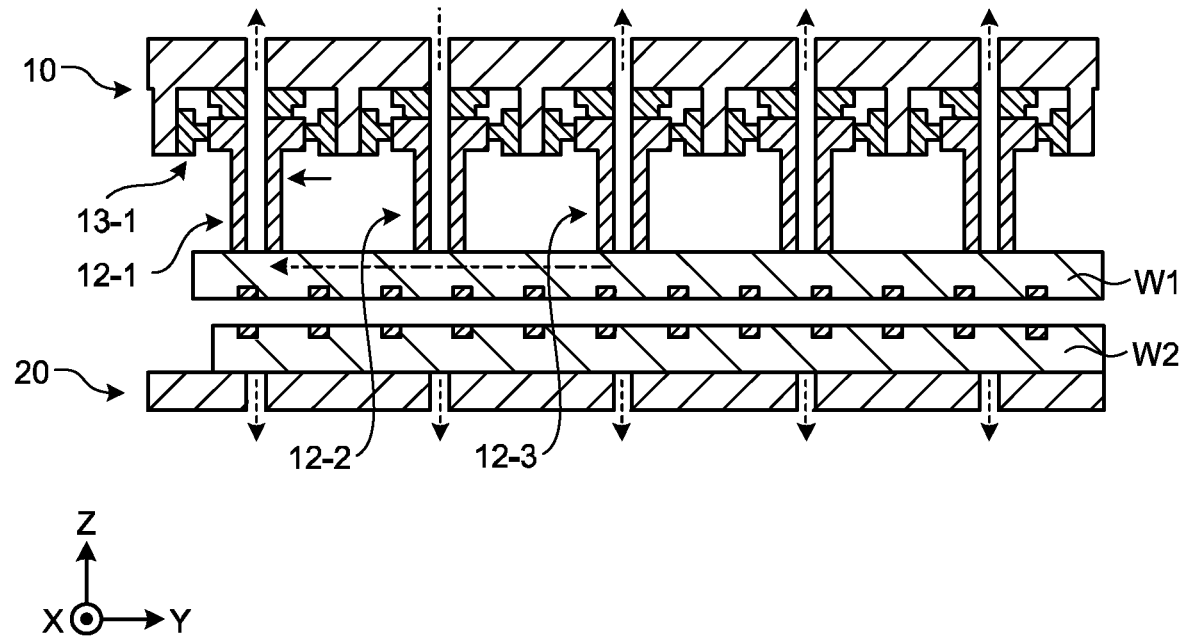
FIG. 5 is a diagram illustrating an operation concerning correction in a first modification of the first embodiment.

For example, when the deviations G1 to G3 illustrated in FIG. 4A have occurred, it may be controlled, as illustrated in FIG. 5, to move the cylindrical member 12-1 in the −Y-direction by the movement amount $\Delta Y1=-G3$, and to set the space (hole 12a) in the cylindrical member 12-2 open to the atmosphere and thereby set this space into an atmospheric pressure state. FIG. 5 is a diagram illustrating an operation concerning correction in a first modification of the first embodiment. FIG. 5 illustrates an atmospheric pressure state by a dotted line without an arrow. At this time, as the position of the cylindrical member 12-3 is fixed on the chucking stage 10, a stress in an elastic distortion mode illustrated by a one-dot chain line can be applied between the chucking position of the cylindrical member 12-3 and the chucking position of the cylindrical member 12-1 on the substrate W1. Also in this case, the distortion of the substrate W1 can be physically corrected.

Alternatively, depending on how distortion has occurred in the substrate, it may be effective to perform correction by intentionally warping the substrate before the bonding.

Figure 6:
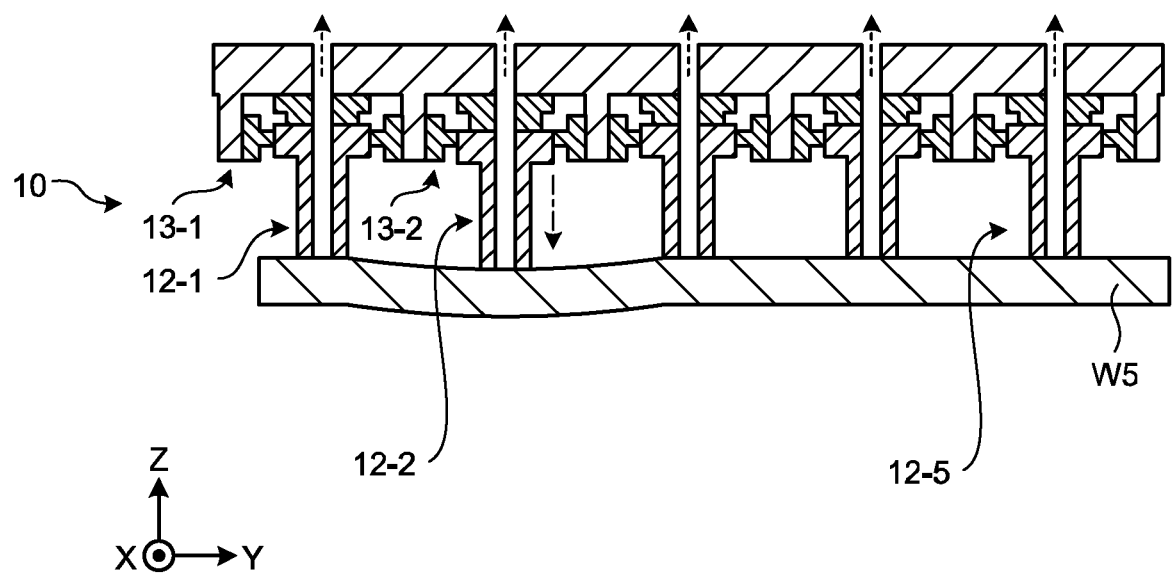
FIG. 6 is a diagram illustrating an operation concerning correction in a second modification of the first embodiment.

For example, in a case where it is known by the condition setting or the like in advance that a warp in the +Z-direction will occur at a position of a substrate W5 corresponding to the cylindrical member 12-2 during the bonding, it may be controlled, as illustrated in FIG. 6, to move the cylindrical member 12-2 in the −Z-direction by a movement amount ΔZ2 (<0), under a state where the substrate W5 is chucked by the plurality of cylindrical members 12-1 to 12-5. FIG. 6 is a diagram illustrating an operation concerning correction in a second modification of the first embodiment. Consequently, it is possible to deform the substrate W5 before the bonding such that the position corresponding to the cylindrical member 12-2 becomes convex toward the −Z-side, and thereby to correct the warp in the +Z-direction of the substrate W5 during the bonding. As a result, it is possible to suppress formation of gas bubbles (voids) at the bonding interface between two substrates.

Figure 7:
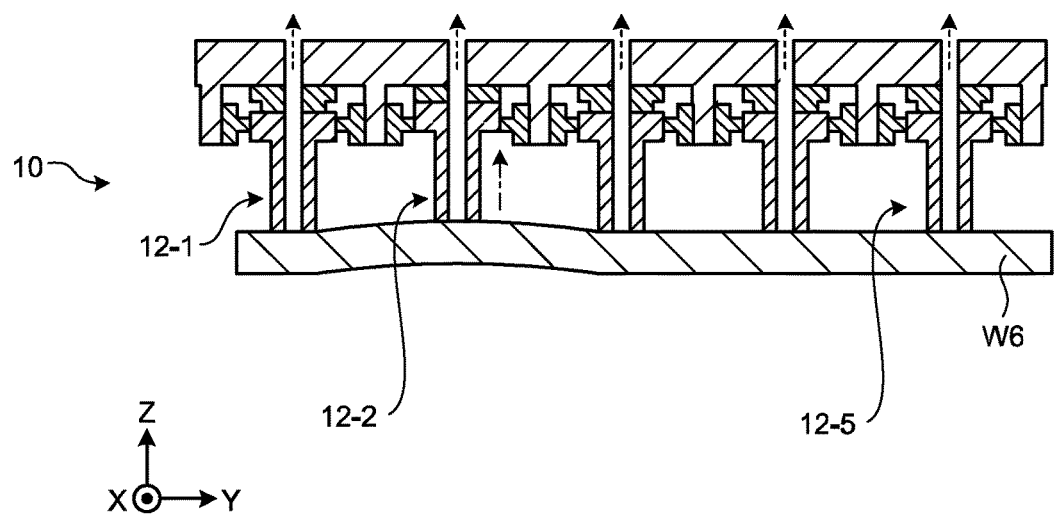
FIG. 7 is a diagram illustrating an operation concerning correction in a third modification of the first embodiment.

Further, in a case where it is known by the condition setting or the like in advance that a warp in the −Z-direction will occur at a position of a substrate W6 corresponding to the cylindrical member 12-2 during the bonding, it may be controlled, as illustrated in FIG. 7, to move the cylindrical member 12-2 in the +Z-direction by a movement amount ΔZ2 (>0), under a state where the substrate W6 is chucked by the plurality of cylindrical members 12-1 to 12-5. FIG. 7 is a diagram illustrating an operation concerning correction in a third modification of the first embodiment. Consequently, it is possible to deform the substrate W6 before the bonding such that the position corresponding to the cylindrical member 12-2 becomes concave toward the +Z-side, and thereby to correct the warp in the −Z-direction of the substrate W6 during the bonding. As a result, it is possible to suppress formation of gas bubbles (voids) at the bonding interface between two substrates.

Figure 8:
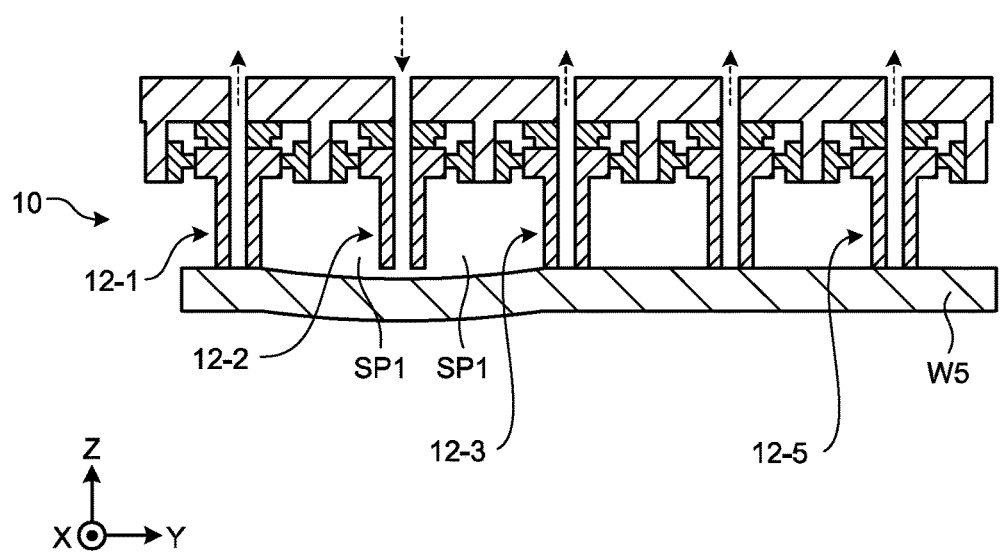
FIG. 8 is a diagram illustrating an operation concerning correction in a fourth modification of the first embodiment.

Further, in a case where it is known by the condition setting or the like in advance that a warp in the +Z-direction will occur at a position of a substrate W5 corresponding to the cylindrical member 12-2 during the bonding, it may be controlled, as illustrated in FIG. 8, to release the chucking by the cylindrical member 12-2. FIG. 8 is a diagram illustrating an operation concerning correction in a fourth modification of the first embodiment. Here, the space (hole 12a) in the cylindrical member 12-2 is controlled to be in a pressurized state, under a state where the substrate W5 is chucked by the plurality of cylindrical members 12-1 to 12-5, so that the chucking to the substrate W5 by the cylindrical member 12-2 is released, and a pressurized room (pressurized space) SP1 to be pressurized is formed between the chucking position of the cylindrical member 12-1 and the chucking position of the cylindrical member 12-3. The pressurized state of the space in the cylindrical member 12-2 is transmitted to the pressurized room SP1, and the position of the substrate W5 corresponding to the cylindrical member 12-2 can be warped in a shape in accordance with the pressure (positive pressure) in the pressurized room SP1. Also in this case, it is possible to deform the substrate W5 before the bonding such that the position corresponding to the cylindrical member 12-2 becomes convex toward the −Z-side, and thereby to correct the warp in the +Z-direction of the substrate W5 during the bonding. As a result, it is possible to suppress formation of gas bubbles (voids) at the bonding interface between two substrates.

Figure 9:
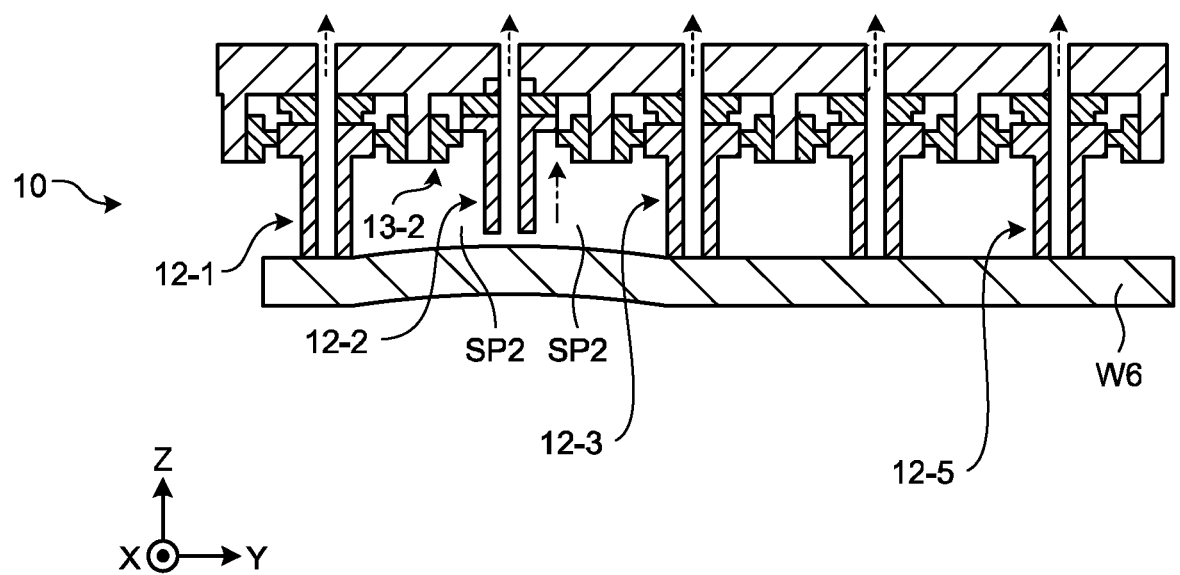
FIG. 9 is a diagram illustrating an operation concerning correction in a fifth modification of the first embodiment.

Further, in a case where it is known by the condition setting or the like in advance that a warp in the −Z-direction will occur at a position of a substrate W6 corresponding to the cylindrical member 12-2 during the bonding, it may be controlled, as illustrated in FIG. 9, to release the chucking by the cylindrical member 12-2. FIG. 9 is a diagram illustrating an operation concerning correction in a fifth modification of the first embodiment. Here, the space (hole 12a) in the cylindrical member 12-2 is controlled to be open to the atmosphere and set into an atmospheric pressure state, under a state where the substrate W6 is chucked by the plurality of cylindrical members 12-1 to 12-5, so that the chucking to the substrate W6 by the cylindrical member 12-2 is released, and a depressurized room (depressurized space) SP2 to be depressurized is formed between the chucking position of the cylindrical member 12-1 and the chucking position of the cylindrical member 12-3. In this state, the cylindrical member 12-2 is moved in the +Z-direction by a movement amount ΔZ2 (>0), and the space (hole 12a) in cylindrical member 12-2 is controlled to be in a depressurized state. The depressurized state of the space is transmitted to the depressurized room SP2, and the position of the substrate W6 corresponding to the cylindrical member 12-2 can be warped in a shape in accordance with the pressure (negative pressure) in the depressurized room SP2. Also in this case, it is possible to deform the substrate W6 before the bonding such that the position corresponding to the cylindrical member 12-2 becomes concave toward the +Z-side, and thereby to correct the warp in the −Z-direction of the substrate W6 during the bonding. As a result, it is possible to suppress formation of gas bubbles (voids) at the bonding interface between two substrates.

Second Embodiment

Next, an explanation will be given of a substrate bonding apparatus according to the second embodiment. Hereinafter, an explanation will be given by mainly focusing on part different from the first embodiment.

In the first embodiment, a configuration is illustrated as an example in which one of the two chucking stages is used to physically perform distortion correction on a substrate while supporting the substrate at multiple points. In the second embodiment, both of the two chucking stages are used to physically perform distortion correction on substrates while supporting the substrates at multiple points.

Figure 10:
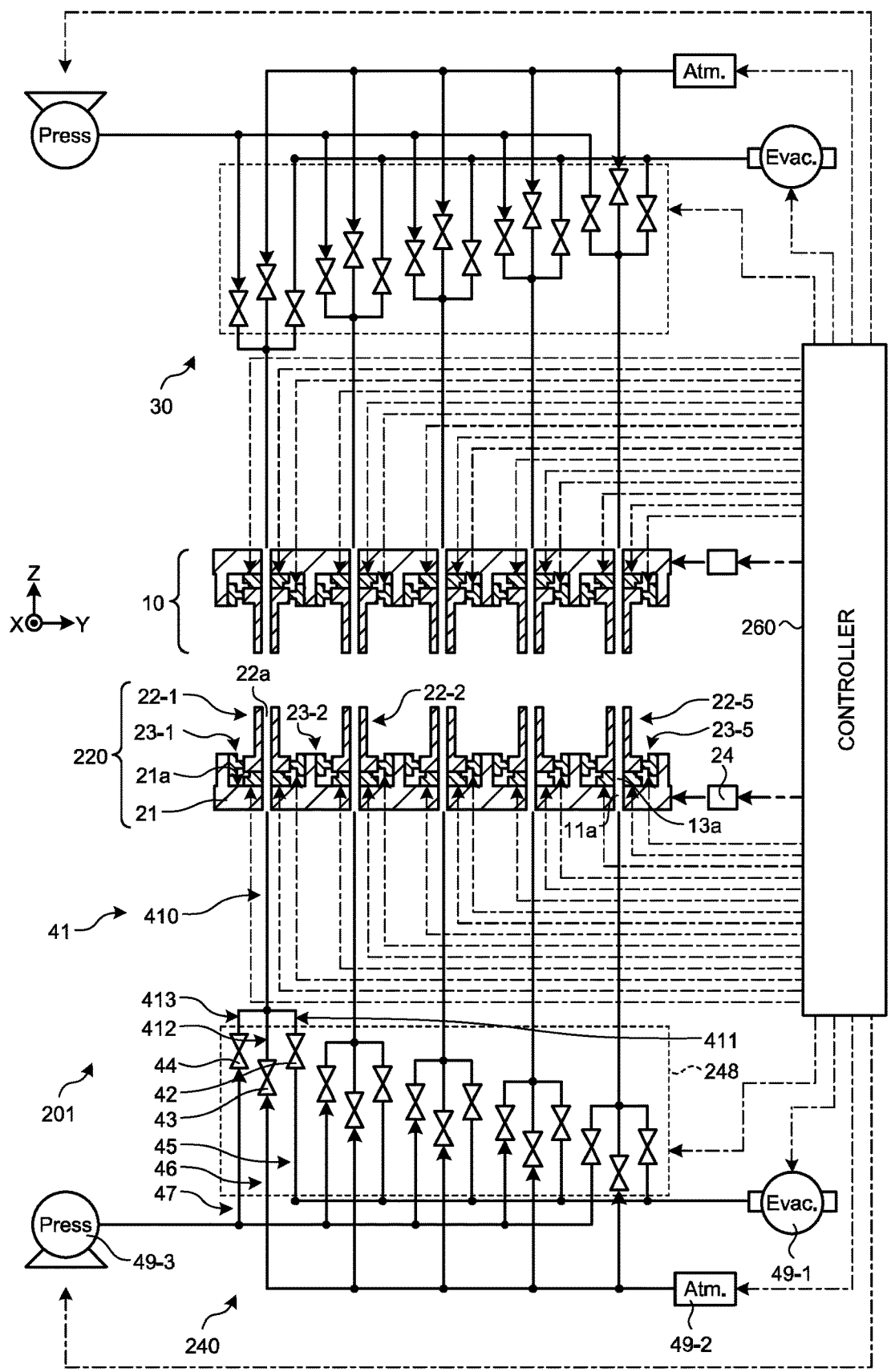
FIG. 10 is a diagram illustrating a configuration of a substrate bonding apparatus according to a second embodiment.

Specifically, the substrate bonding apparatus 201 may be configured as illustrating in FIG. 10. FIG. 10 is a diagram illustrating a configuration of a substrate bonding apparatus 201.

The substrate bonding apparatus 201 includes a chucking stage 220, a pressure control mechanism 240, and a controller 260, in place of the chucking stage 20, the depressurizing control mechanism 40, and the controller 60 (see FIG. 1).

In addition to the stage base 21 and the drive mechanism 24, the chucking stage 220 includes a plurality of cylindrical members 22-1 to 22-5 and a plurality of drive mechanisms 23-1 to 23-5. The chucking stage 220 chucks and holds a substrate by the plurality of cylindrical members 22-1 to 22-5, drives the plurality of cylindrical members 22-1 to 22-5 collectively by the drive mechanism 24, and drives the plurality of cylindrical members 22-1 to 22-5 independently of each other by the plurality of drive mechanisms 23-1 to 23-5. Each of the plurality of cylindrical members 22-1 to 22-5 protrudes in the +Z-direction from the main face 21a of the stage base 21, and includes a hole 22a penetrating in the Z-direction, to chuck and hold the substrate at its +Z-side distal end when the hole 22a is controlled to be in a depressurized state. The plurality of cylindrical members 22-1 to 22-5 support the substrate at positions different from each other in the X- and Y-directions. Consequently, the substrate is supported at multiple points. The drive mechanism 24 drives the stage base 21 in the X-, Y-, and Z-directions under the control of the controller 260, to move the plurality of cylindrical members 22-1 to 22-5 collectively and globally. The plurality of drive mechanisms 23-1 to 23-5 moves the plurality of cylindrical members 22-1 to 22-5 individually under the control of the controller 260.

The plurality of cylindrical members 22-1 to 22-5 are disposed on the main face 21a, and are arrayed in the X- and Y-directions. The plurality of drive mechanisms 23-1 to 23-5 correspond to the plurality of cylindrical members 22-1 to 22-5, respectively. Each of the drive mechanisms 23 is disposed around the corresponding cylindrical member 22.

The pressure control mechanism 240 controls the pressure states of spaces in the plurality of cylindrical members 22-1 to 22-5 independently of each other under the control of the controller 260. The pressure control mechanism 240 includes a switching section 248 in place of the switching section 48 (see FIG. 1), and further includes a pressure generation unit 49-3. The pressure generation unit 49-3 is a pressurizing unit, such as a compressor, and generates a pressurized state by applying a positive pressure to gas under the control of the controller 260.

The switching section 248 can connect each of the plurality of tubes 41 to any one of the plurality of pressure generation units 49-1 to 49-3 under the control of the controller 260. The switching section 248 can individually switch the connection between each of the tubes 41 to the plurality of pressure generation units 49-1 to 49-3. The switching section 248 individually connects each of the tubes 41 to any one of the plurality of pressure generation units 49-1 to 49-3 under the control of the controller 260.

The switching section 248 includes on-off valves 42, on-off valves 43, a depressurizing tube (depressurizing line) 45, an atmospheric tube (atmosphere opening line) 46, and a pressurizing tube (pressurizing line) 47. Each of the on-off valves 42 opens/closes the connection between the corresponding tube 41 (branch tube 411) and the depressurizing tube 45 under the control of the controller 260. When an on-off valve 42 is in an opened state, the pressure generation unit (depressurizing unit) 49-1 can vacuum-exhaust the hole 22a of the corresponding cylindrical member 22 and thereby set this hole 22a into a depressurized state, through the corresponding hole 11c, hole 13a, and tube 41, and the depressurizing tube 45. Each of the on-off valves 43 opens/closes the connection between the corresponding tube 41 (branch tube 411) and the atmospheric tube 46 under the control of the controller 260. When an on-off valve 43 is in an opened state, the pressure generation unit (atmosphere opening unit) 49-2 can set the hole 22a of the corresponding cylindrical member 22 open to the atmosphere and thereby set this hole 22a into an atmospheric pressure state, through the corresponding hole 11c, hole 13a, and tube 41, and the atmospheric tube 46. When an on-off valve 44 is in an opened state, the pressure generation unit (pressurizing unit) 49-3 can supply gas into the hole 22a of the corresponding cylindrical member 22 and thereby set this hole 22a into a pressurized state, through the corresponding hole 11c, hole 13a, and tube 41, and the pressurizing tube 47.

In a case where a substrate W3 corresponding to a substrate W1 to be chucked by the chucking stage 10 (see FIG. 11A) and a substrate W4 corresponding to a substrate W2 to be chucked by the chucking stage 220 (see FIG. 11A) are prepared, the controller 260 allocates distortion correction amounts to the substrate W3 and the substrate W4 for the distortion difference between the substrate W3 and the substrate W4. As pre-processing, the controller 260 acquires each of a distortion correction amount for the substrate W3 and a distortion correction amount for the substrate W4 to be allocated. The distortion correction amount for the substrate W3 can be deemed as a distortion correction amount for the substrate W1, and the distortion correction amount for the substrate W4 can be deemed as a distortion correction amount for the substrate W2. In accordance with the distortion correction amount for the substrate W3 (i.e., the distortion correction amount for the substrate W1), the controller 260 controls at least one of the set of plurality of drive mechanisms 13-1 to 13-5 and the pressure control mechanism 30 to correct the distortion of the substrate W1, under a state where the substrate W1 is chucked by the plurality of cylindrical members 12-1 to 12-5. Together with this, in accordance with the distortion correction amount for the substrate W4 (i.e., the distortion correction amount for the substrate W2), the controller 260 controls at least one of the set of plurality of drive mechanisms 23-1 to 23-5 and the pressure control mechanism 240 to correct the distortion of the substrate W2, under a state where the substrate W2 is chucked by the plurality of cylindrical members 22-1 to 22-5.

Figure 11A:
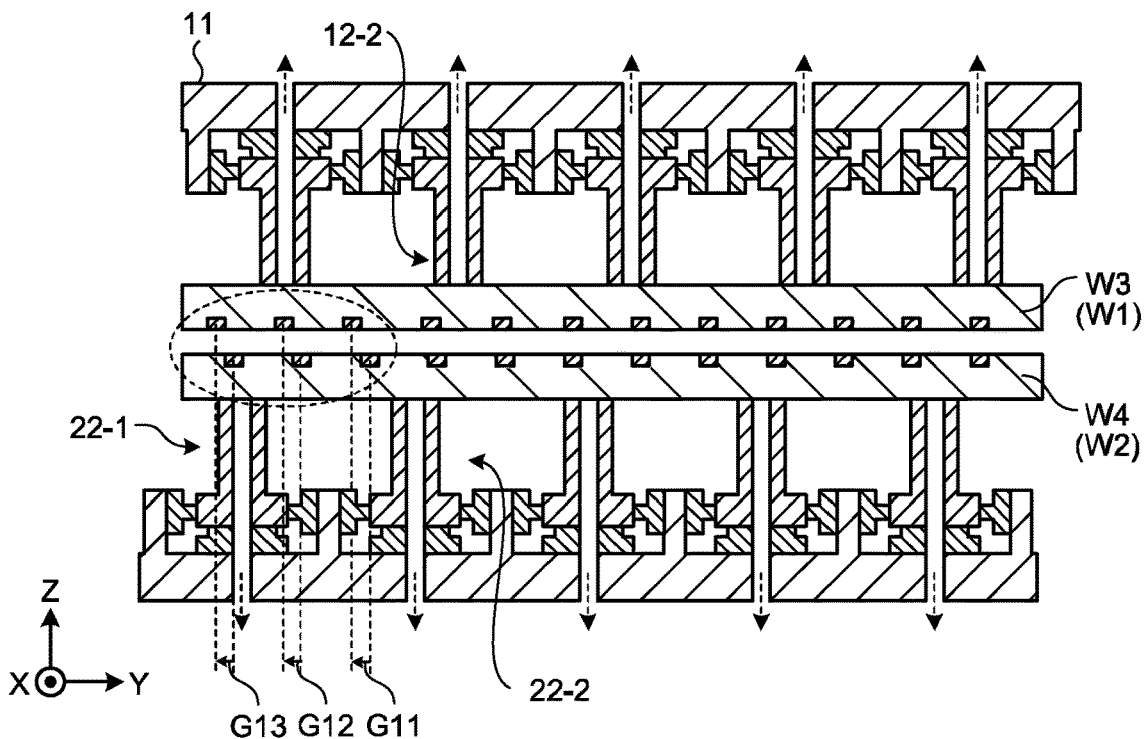
FIGS. 11A and 11B are diagrams illustrating an operation concerning correction in the second embodiment.

For example, in the condition setting, as illustrated by a surrounding dotted line in FIG. 11A, the controller 260 performs image processing and thereby specifies that positional deviations have occurred in a region on the −Y-side of the substrate W3, and further obtains deviations G11 to G13 of the positions of these electrode pads of the substrate W3 with respect to the positions of the corresponding electrode pads of the substrate W4. Each of the deviations G11 to G13 can be deemed as a vector quantity with magnitude and direction. For example, each of the deviations G11 to G13 has a direction away from the central portion of the substrate W3 to the outer side (the leftward direction in FIG. 11A).

At this time, the controller 260 determines respective movement amounts of cylindrical members 12 and cylindrical members 22, and determines respective pressures for controlling the spaces in the cylindrical members 12 and the spaces in the cylindrical members 22, so as to cancel the deviations G11 to G13. Specifically, it may be set that the movement amount of the cylindrical member 12-1 is $\Delta Y1=-G13 \times k$ ("k" is a value larger than 0 and smaller than 1), the movement amount of the cylindrical member 12-2 is $\Delta Y2=-G11$, and the movement amount of the cylindrical member 22-1 is $\Delta Y11=-G13 \times (1-k)$. Further, it may be set that the spaces in the cylindrical members 22 should be open to the atmosphere.

Figure 11B:
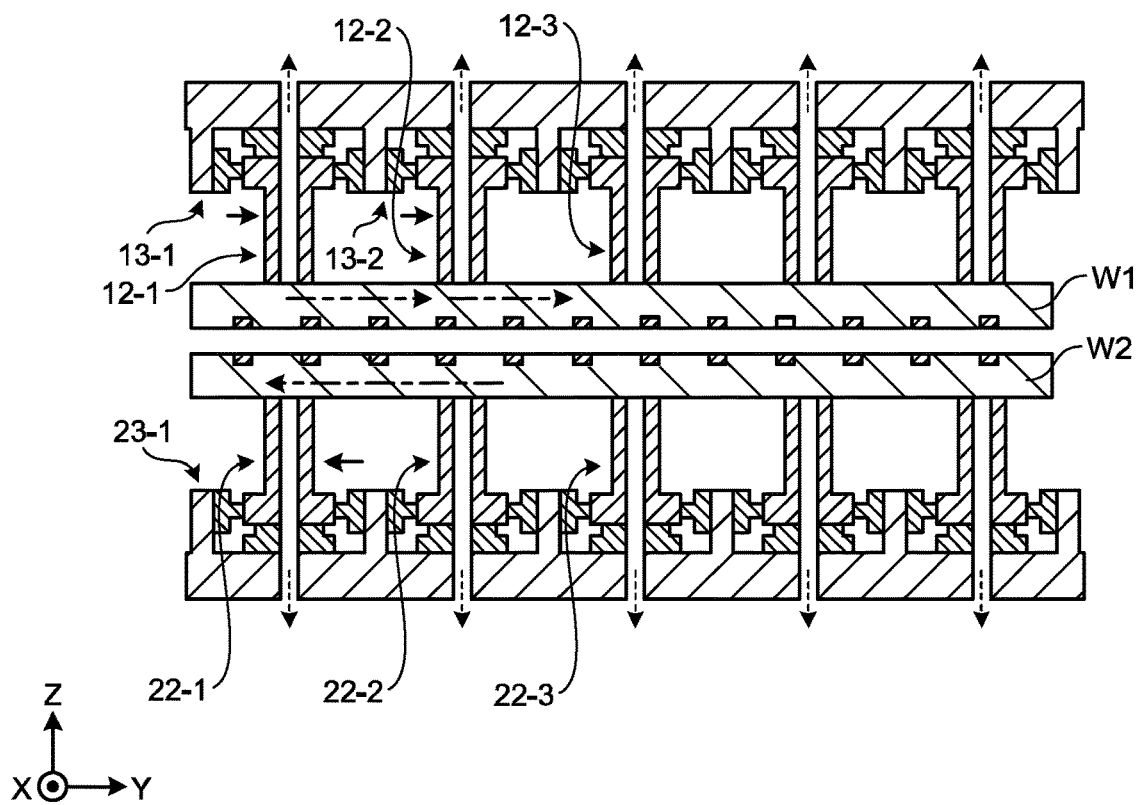

Then, in the main joining, as illustrated in FIG. 11B, the controller 260 operates to move the cylindrical member 12-1 in the +Y-direction by the movement amount $\Delta Y1=-G13 \times k$, move the cylindrical member 12-2 in the +Y-direction by the movement amount $\Delta Y2=-G11$, and move the cylindrical member 22-1 in the −Y-direction by the movement amount $\Delta Y11=-G13 \times (1-k)$. Together with this, the controller 260 operates to set the space (hole 22a) in the cylindrical member 22-2 open to the atmosphere and thereby set this space into an atmospheric pressure state. At this time, as the position of the cylindrical member 12-3 is fixed, a stress in an elastic distortion mode illustrated by a one-dot chain line can be applied between the chucking position of the cylindrical member 12-3 and the chucking position of the cylindrical member 12-2 on the substrate W1. Further, as both of the cylindrical member 12-1 and the cylindrical member 12-2 are moved, a stress in a forcible distortion mode illustrated by a two-dot chain line can be applied between the chucking position of the cylindrical member 12-2 and the chucking position of the cylindrical member 12-1 on the substrate W1. Further, as the positions of the cylindrical members 22-1 and 22-3 are fixed, a stress in an elastic distortion mode illustrated by a one-dot chain line can be applied between the chucking position of the cylindrical member 22-3 and the chucking position of the cylindrical member 22-1 on the substrate W2. Consequently, the distortion of the substrate W1 can be corrected in a manner in which the distortion at a location with a larger distortion is corrected while the distance between any two points is changed in the elastic distortion mode, and in which the distortion at a location with a smaller distortion is corrected while the distance between any two points is maintained in the forced distortion mode. Further, the distortion of the substrate W2 can be corrected in a manner in which the distortion at a location with a larger distortion is corrected while the distance between any two points is changed in the elastic distortion mode.

As described above, in the substrate bonding apparatus 201, both of the two chucking stages 10 and 220 are used to physically perform distortion correction on substrates while supporting the substrates at multiple points. Consequently, as the distortion difference between the two substrates W1 and W2 can be physically corrected while the distortion correction amounts are allocated to the two substrates W1 and W2, it is possible to correct the substrate distortion difference more reliably. Further, where substrates have more complicated topography, the distortion of the substrates due to this topography can be corrected. As a result, it is possible to bond the two substrates W1 and W2 to each other with higher accuracy.

Alternatively, the distortion correction and bonding between the two substrates W1 and W2 may be performed as illustrated in FIGS. 12A to 14B. FIGS. 12A to 14B are diagrams illustrating an operation of the substrate bonding apparatus 201, according to a modification of the second embodiment. The operation illustrated in FIGS. 12A to 14B is effective in a case where the correction and bonding are performed between two substrates having complicated topography.

Figure 12A:
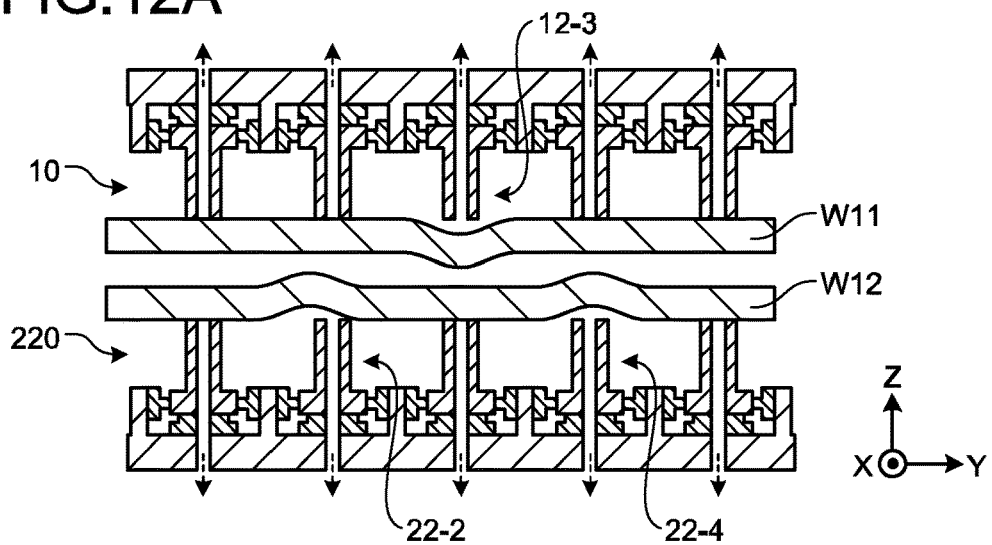
FIGS. 12A to 12C are diagrams illustrating part of an operation of the substrate bonding apparatus, according to a modification of the second embodiment.

As illustrated in FIG. 12A, substrates W11 and W12, which have recesses and projections different from each other, are chucked by the plurality of cylindrical members 12-1 to 12-5 and 22-1 to 22-5 of the chucking stages 10 and 220.

Figure 12B:
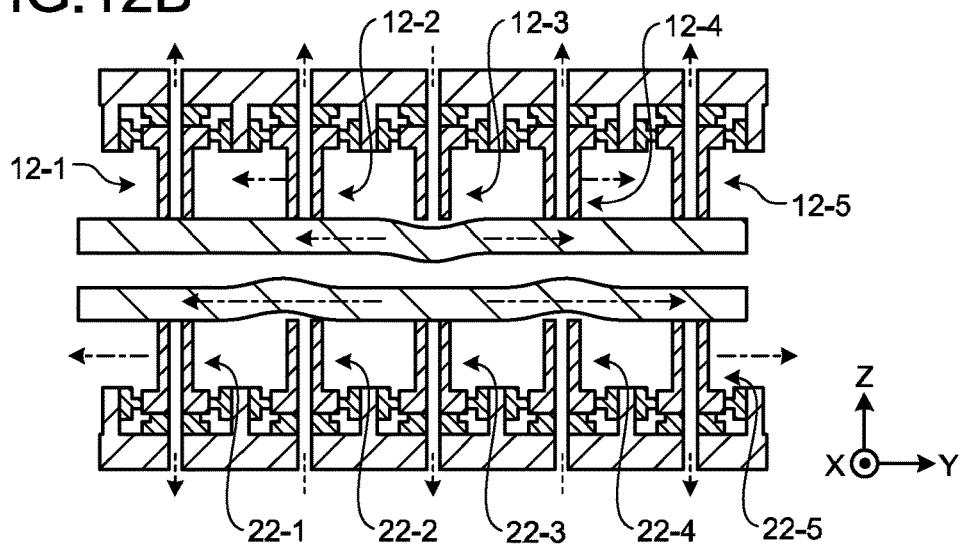
Figure 12C:
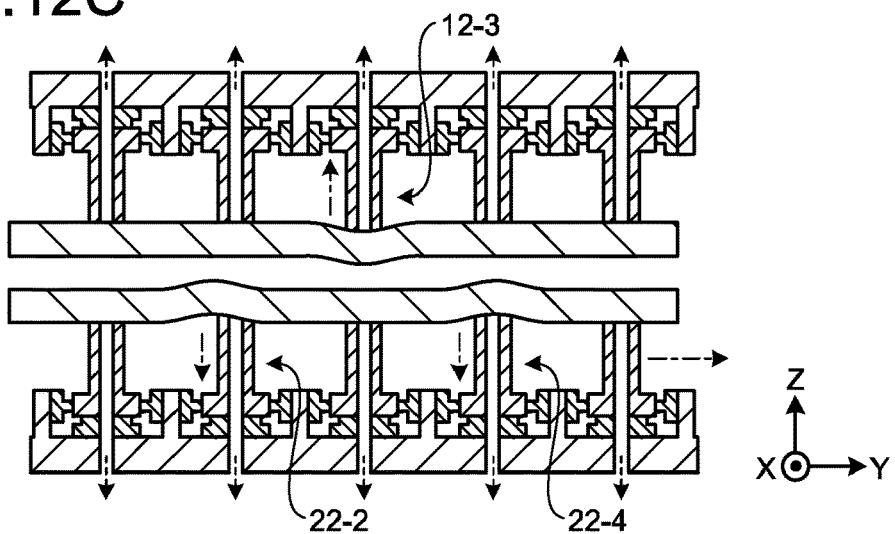

Then, as illustrated in FIG. 12B, the cylindrical members 12-2, 12-4, 22-1, and 22-5, which are present around the cylindrical members 12-3, 22-2, and 22-4 with chucking leakage, are driven in the X- and Y-directions, and, as illustrated in FIG. 12C, the cylindrical members 12-3, 22-2, and 22-4 with chucking leakage are driven in the Z-direction, so as to chuck the substrates W11 and W12 over the entire faces. Here, the driving in the X- and Y-directions illustrated in FIG. 12B and the driving in the Z-direction illustrated in FIG. 12C may be performed stepwise or may be performed simultaneously.

Figure 13A:
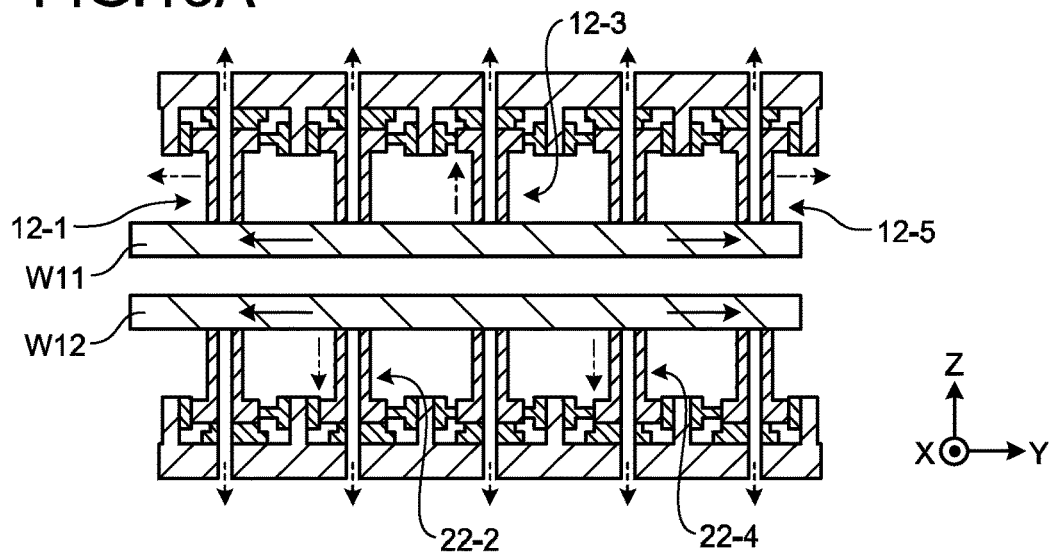
FIGS. 13A to 13C are diagrams illustrating part of the operation of the substrate bonding apparatus, according to the modification of the second embodiment.

Then, as illustrated in FIG. 13A, under a state where the substrate W11 is chucked by the plurality of cylindrical members 12-1 to 12-5 and the substrate W12 is chucked by the plurality of cylindrical members 22-1 to 22-5, the cylindrical members 12-1, 12-3, 12-5, 22-2, and 22-4 specified are driven in the X-, Y-, and Z-directions, to correct the recesses and projections together with the electrode alignment deviation.

Figure 13B:
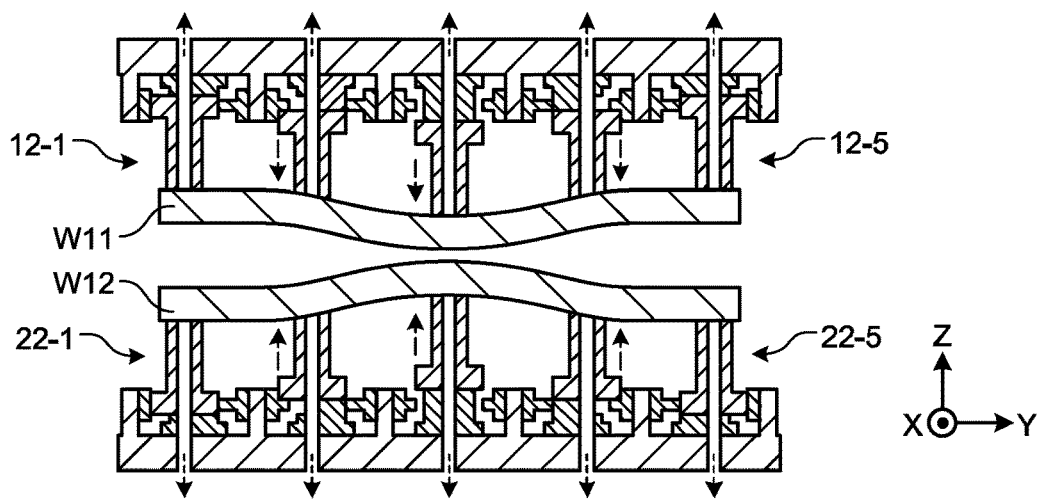

Thereafter, as illustrated in FIG. 13B, in order to eliminate correction deviation and to prevent intrusion of gas bubbles, the plurality of cylindrical members 12-1 to 12-5 and the plurality of cylindrical members 22-1 to 22-5 are driven in the Z-direction to deform the substrate W11 and the substrate W12 to be line symmetric in the Z-direction. Consequently, the substrate W11 and the substrate W12 are made into convex shapes that face each other.

Figure 13C:
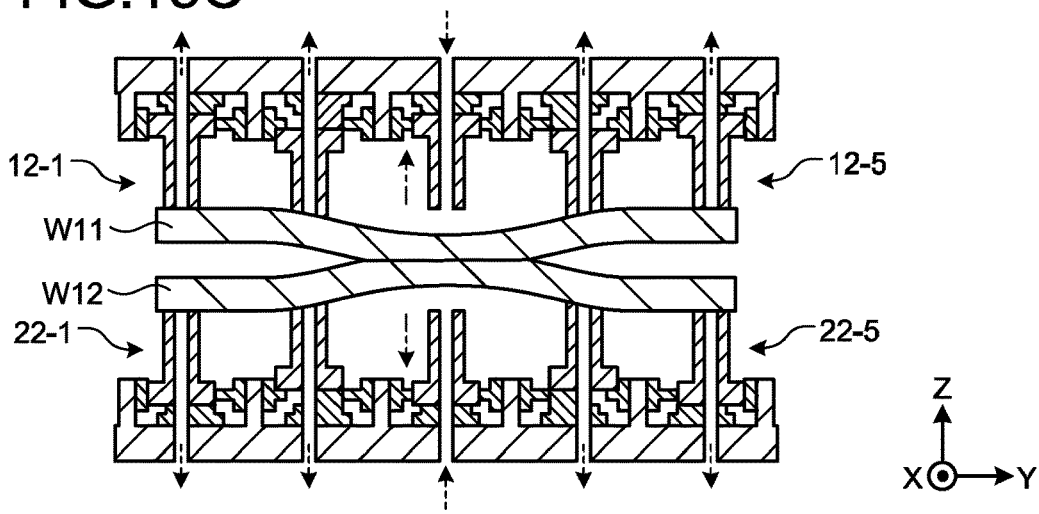

Thereafter, as illustrated in FIG. 13C, the chucking stage 10 is moved downward in the −Z-direction or the chucking stage 220 is moved upward in the +Z-direction, to bring the central portions of the substrates W11 and W12 into contact with each other. Consequently, the bonding between the substrates W11 and W12 is started from their central portions. After the threshold load of starting the bonding is exceeded, some of the cylindrical members 12 and 22 corresponding to the part where the bonding has been completed are switched into a fluid-pressurized state. Here, the angle formed between the two substrates W11 and W12 at the bonding interface is controlled not to change, and these cylindrical members 12 and 22 are driven in the Z-direction to separate from the substrates W11 and W12.

Figure 14A:
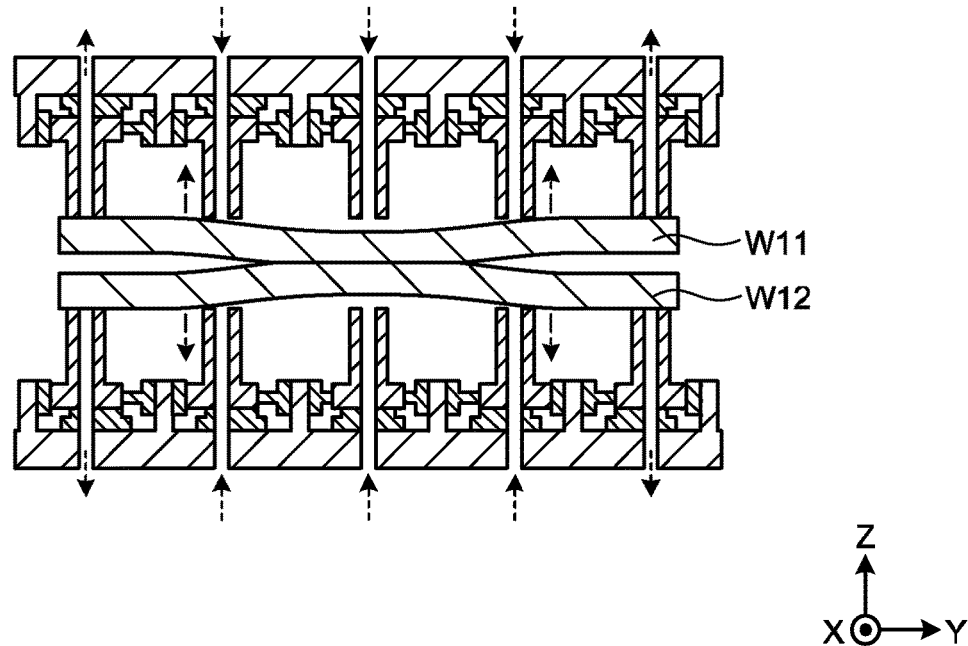
FIGS. 14A and 14B are diagrams illustrating part of the operation of the substrate bonding apparatus, according to the modification of the second embodiment.

As illustrated in FIG. 14A, as the bonding is being developed in the planar radial directions of the substrates W11 and W12, the corresponding cylindrical members 12 and 22 are separated from the substrates W11 and W12. These cylindrical members 12 and 22 are switched into a pressurized state, while the applied pressure is controlled such that the angle formed between the two substrates W11 and W12 at the bonding interface becomes gradually smaller.

Figure 14B:
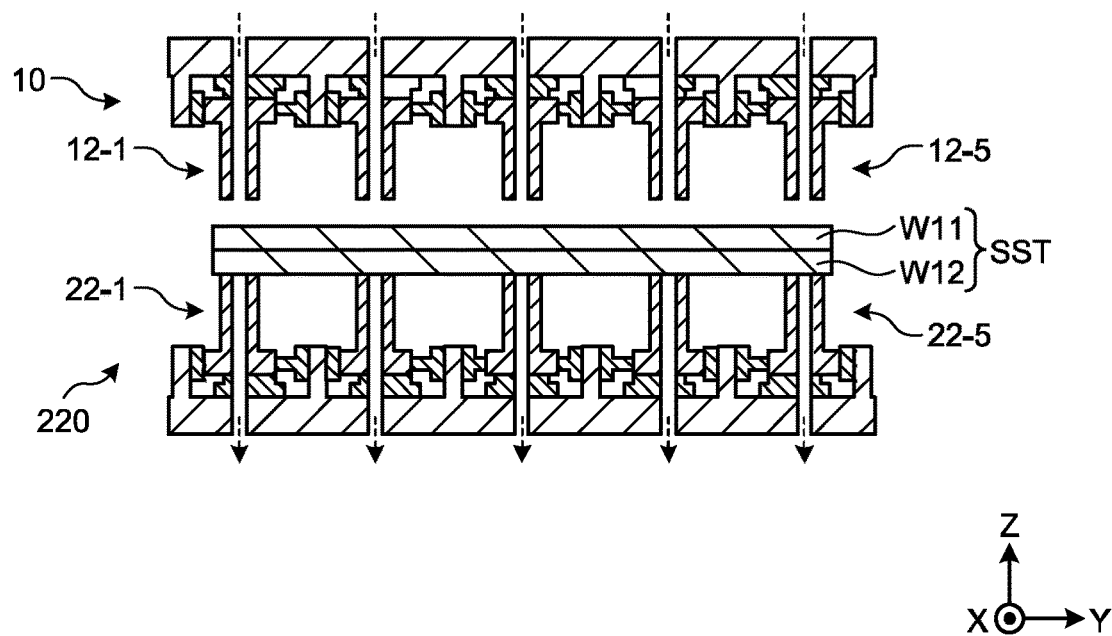

As illustrated in FIG. 14B, when the bonding is completed, the cylindrical members 12-1 to 12-5 of the chucking stage 10 are set open to the atmosphere, while the cylindrical members 22-1 to 22-5 of the chucking stage 220 are kept in chucking, to hold the laminated body SST of the substrate W11 and the substrate W12 bonded to each other.

As described above, after the distortion correction, the two substrates are set to be warped into convex shapes that are line symmetric with each other when seen in a cross section. Consequently, it is possible to bond the substrates to each other stepwise while effectively releasing gas between the substrate, so as to suppress generation of gas bubbles at the bonding interface.

(Supplement 1)

A substrate bonding apparatus comprising:

a first chucking stage configured to chuck a first substrate; and a second chucking stage disposed facing the first chucking stage, and configured to chuck a second substrate, wherein the first chucking stage includes a first stage base including a first main face facing the second chucking stage, a plurality of first cylindrical members disposed on the first main face, arrayed in planar directions, and protruding from the first main face in a direction toward the second chucking stage, to chuck the first substrate, and a plurality of first drive mechanisms configured to drive the plurality of first cylindrical members independently of each other, and the substrate bonding apparatus further comprises a first pressure control mechanism configured to control pressure states of spaces in the plurality of first cylindrical members independently of each other.

(Supplement 2)

The substrate bonding apparatus according to supplement 1, wherein the second chucking stage includes a second stage base including a second main face facing the first chucking stage, a plurality of second cylindrical members disposed on the second main face, arrayed in planar directions, and protruding from the second main face in a direction toward the first chucking stage, to chuck the second substrate, and a plurality of second drive mechanisms configured to drive the plurality of second cylindrical members independently of each other, and the substrate bonding apparatus further comprises a second pressure control mechanism configured to control pressure states of spaces in the plurality of second cylindrical members independently of each other.

(Supplement 3)

The substrate bonding apparatus according to supplement 1, wherein the first pressure control mechanism includes a plurality of first tubes communicating with the spaces in the plurality of first cylindrical members, a plurality of first pressure generation units configured to generate pressure states different from each other, and a first switching section configured to connect each of the plurality of first tubes to one of the plurality of first pressure generation units.

(Supplement 4)

The substrate bonding apparatus according to supplement 2, wherein the first pressure control mechanism includes a plurality of first tubes communicating with the spaces in the plurality of first cylindrical members, a plurality of first pressure generation units configured to generate pressure states different from each other, and a first switching section configured to connect each of the plurality of first tubes to one of the plurality of first pressure generation units, and the second pressure control mechanism includes a plurality of second tubes communicating with the spaces in the plurality of second cylindrical members, a plurality of second pressure generation units configured to generate pressure states different from each other, and a second switching section configured to connect each of the plurality of second tubes to one of the plurality of second pressure generation units.

(Supplement 5)

The substrate bonding apparatus according to supplement 3, wherein the plurality of first pressure generation units include a first depressurizing unit, a first atmosphere opening unit, and a first pressurizing unit.

(Supplement 6)

The substrate bonding apparatus according to supplement 4, wherein the plurality of first pressure generation units include a first depressurizing unit, a first atmosphere opening unit, and a first pressurizing unit, and the plurality of second pressure generation units include a second depressurizing unit, a second atmosphere opening unit, and a second pressurizing unit.

(Supplement 7)

The substrate bonding apparatus according to supplement 1, further comprising a controller configured to control, in accordance with a distortion correction amount for the first substrate, at least one of a set of the plurality of first drive mechanisms and the first pressure control mechanism, under a state where the first substrate is chucked by the plurality of first cylindrical members, to correct distortion of the first substrate.

(Supplement 8)

The substrate bonding apparatus according to supplement 2, further comprising a controller configured to control, in accordance with a distortion correction amount for the first substrate, at least one of a set of the plurality of first drive mechanisms and the first pressure control mechanism, under a state where the first substrate is chucked by the plurality of first cylindrical members, to correct distortion of the first substrate, and to control, in accordance with a distortion correction amount for the second substrate, at least one of a set of the plurality of second drive mechanisms and the second pressure control mechanism, under a state where the second substrate is chucked by the plurality of second cylindrical members, to correct distortion of the second substrate.

(Supplement 9)

The substrate bonding apparatus according to supplement 8, wherein the controller is further configured to control the plurality of first drive mechanisms to deform the first substrate such that a central portion of the first substrate thus corrected becomes convex toward the second substrate, and control the plurality of second drive mechanism to deform the second substrate such that a central portion of the second substrate thus corrected becomes convex toward the first substrate, so as to bring the first substrate and the second substrate into contact with each other, and to control the first pressure control mechanism to release chucking to the first substrate by the plurality of first cylindrical members sequentially from the central portion of the first substrate to an outer side, and control the second pressure control mechanism to release chucking to the second substrate by the plurality of second cylindrical members sequentially from the central portion of the second substrate to an outer side.

(Supplement 10)

The substrate bonding apparatus according to supplement 9, wherein the controller is configured to control the plurality of first drive mechanisms and the plurality of second drive mechanisms to deform the first substrate and the second substrate symmetrically with each other when seen in a cross section.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate bonding apparatus comprising:

a first chucking stage configured to chuck a first substrate; and a second chucking stage disposed facing the first chucking stage, and configured to chuck a second substrate, wherein the first chucking stage includes
a first stage base including a first main face facing the second chucking stage,
a plurality of first cylindrical members disposed on the first main face, arrayed in a planar direction, and protruding from the first main face in a vertical direction to chuck the first substrate, the planar direction being a direction along the first main face, the vertical direction being a direction perpendicular to the planar direction, and
a plurality of first drive mechanisms configured to drive the plurality of first cylindrical members independently of each other in the planar direction and to drive the plurality of first cylindrical members independently of each other in the vertical direction, and
the substrate bonding apparatus further comprises a first pressure control mechanism configured to control pressure states of spaces in the plurality of first cylindrical members independently of each other.

2. The substrate bonding apparatus according to claim 1, wherein
the second chucking stage includes
a second stage base including a second main face facing the first chucking stage,
a plurality of second cylindrical members disposed on the second main face, arrayed in the planar direction, and protruding from the second main face in the vertical direction to chuck the second substrate, and
a plurality of second drive mechanisms configured to drive the plurality of second cylindrical members independently of each other in the planar direction and independently of each other in the vertical direction, and
the substrate bonding apparatus further comprises a second pressure control mechanism configured to control pressure states of spaces in the plurality of second cylindrical members independently of each other.

3. The substrate bonding apparatus according to claim 2, wherein
the first pressure control mechanism includes
a plurality of first tubes communicating with the spaces in the plurality of first cylindrical members,
a plurality of first pressure generation units configured to generate pressure states different from each other, and
a first switching section configured to connect each of the plurality of first tubes to one of the plurality of first pressure generation units, and
the second pressure control mechanism includes
a plurality of second tubes communicating with the spaces in the plurality of second cylindrical members,
a plurality of second pressure generation units configured to generate pressure states different from each other, and
a second switching section configured to connect each of the plurality of second tubes to one of the plurality of second pressure generation units.

4. The substrate bonding apparatus according to claim 3, wherein
the plurality of first pressure generation units include
a first depressurizing unit,
a first atmosphere opening unit, and
a first pressurizing unit, and
the plurality of second pressure generation units include
a second depressurizing unit,
a second atmosphere opening unit, and
a second pressurizing unit.

5. The substrate bonding apparatus according to claim 2, further comprising
a controller configured to control, in accordance with a distortion correction amount for the first substrate, at least one of a set of the plurality of first drive mechanisms and the first pressure control mechanism, under a state where the first substrate is chucked by the plurality of first cylindrical members, to correct distortion of the first substrate, and to control, in accordance with a distortion correction amount for the second substrate, at least one of a set of the plurality of second drive mechanisms and the second pressure control mechanism, under a state where the second substrate is chucked by the plurality of second cylindrical members, to correct distortion of the second substrate.

6. The substrate bonding apparatus according to claim 5, wherein
the controller is configured to control a movement amount of each of the first cylindrical members in the planar direction, in accordance with a distortion correction amount for the first substrate, and to control a movement amount of each of the second cylindrical members in the planar direction, in accordance with a distortion correction amount for the second substrate.

7. The substrate bonding apparatus according to claim 5, wherein
the controller is configured to control a movement amount of each of the first cylindrical members in the planar direction, and control a pressure state of each of the spaces in the first cylindrical members by the first pressure control mechanism, in accordance with a distortion correction amount for the first substrate, and to control a movement amount of each of the second cylindrical members in the planar direction, and control a pressure state of each of the spaces in the second cylindrical members by the second pressure control mechanism, in accordance with a distortion correction amount for the second substrate.

8. The substrate bonding apparatus according to claim 5, wherein
the controller is configured to control a movement amount of each of the first cylindrical members in the vertical direction in accordance with a distortion correction amount for the first substrate, and to control a movement amount of each of the second cylindrical members in the vertical direction in accordance with a distortion correction amount for the second substrate.

9. The substrate bonding apparatus according to claim 5, wherein
the controller is configured to control a pressure state of each of the spaces in the first cylindrical members by the first pressure control mechanism, in accordance with a distortion correction amount for the first substrate, and to control a pressure state of each of the spaces in the second cylindrical members by the second pressure control mechanism, in accordance with a distortion correction amount for the second substrate.

10. The substrate bonding apparatus according to claim 5, wherein
the controller is configured to control a movement amount of each of the first cylindrical members in the vertical direction and control a pressure state of each of the spaces in the first cylindrical members by the first pressure control mechanism, in accordance with a distortion correction amount for the first substrate, and to control a movement amount of each of the second cylindrical members in the vertical direction, and control a pressure state of each of the spaces in the second cylindrical members by the second pressure control mechanism, in accordance with a distortion correction amount for the second substrate.

11. The substrate bonding apparatus according to claim 5, wherein
the controller is further configured to control the plurality of first drive mechanisms to deform the first substrate such that a central portion of the first substrate thus corrected becomes convex toward the second substrate, and control the plurality of second drive mechanism to deform the second substrate such that a central portion of the second substrate thus corrected becomes convex toward the first substrate, so as to bring the first substrate and the second substrate into contact with each other, and to control the first pressure control mechanism to release chucking to the first substrate by the plurality of first cylindrical members sequentially from the central portion of the first substrate to an outer side, and control the second pressure control mechanism to release chucking to the second substrate by the plurality of second cylindrical members sequentially from the central portion of the second substrate to an outer side.

12. The substrate bonding apparatus according to claim 11, wherein
the controller is configured to control the plurality of first drive mechanisms and the plurality of second drive mechanisms to deform the first substrate and the second substrate symmetrically with each other when seen in a cross section.

13. The substrate bonding apparatus according to claim 1, wherein the first pressure control mechanism includes
a plurality of first tubes communicating with the spaces in the plurality of first cylindrical members,
a plurality of first pressure generation units configured to generate pressure states different from each other, and
a first switching section configured to connect each of the plurality of first tubes to one of the plurality of first pressure generation units.

14. The substrate bonding apparatus according to claim 13, wherein
the plurality of first pressure generation units include
a first depressurizing unit,
a first atmosphere opening unit, and
a first pressurizing unit.

15. The substrate bonding apparatus according to claim 1, further comprising
a controller configured to control, in accordance with a distortion correction amount for the first substrate, at least one of a set of the plurality of first drive mechanisms and the first pressure control mechanism, under a state where the first substrate is chucked by the plurality of first cylindrical members, to correct distortion of the first substrate.

16. The substrate bonding apparatus according to claim 15, wherein
the controller is configured to control a movement amount of each of the first cylindrical members in the planar direction, in accordance with a distortion correction amount for the first substrate.

17. The substrate bonding apparatus according to claim 15, wherein
the controller is configured to control a movement amount of each of the first cylindrical members in the planar direction, and control a pressure state of each of the spaces in the first cylindrical members by the first pressure control mechanism, in accordance with a distortion correction amount for the first substrate.

18. The substrate bonding apparatus according to claim 15, wherein
the controller is configured to control a movement amount of each of the first cylindrical members in the vertical direction in accordance with a distortion correction amount for the first substrate.

19. The substrate bonding apparatus according to claim 15, wherein
the controller is configured to control a pressure state of each of the spaces in the first cylindrical members by the first pressure control mechanism, in accordance with a distortion correction amount for the first substrate.

20. The substrate bonding apparatus according to claim 15, wherein
the controller is configured to control a movement amount of each of the first cylindrical members in the vertical direction and control a pressure state of each of the spaces in the first cylindrical members by the first pressure control mechanism, in accordance with a distortion correction amount for the first substrate.

* * * * *